(12) United States Patent
Yamazaki et al.

(10) Patent No.: US 7,015,083 B2
(45) Date of Patent: Mar. 21, 2006

(54) METHOD OF MANUFACTURING A SEMICONDUCTOR DEVICE

(75) Inventors: Shunpei Yamazaki, Setagaya (JP); Setsuo Nakajima, Atsugi (JP); Hidekazu Miyairi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 42 days.

(21) Appl. No.: 10/944,933

(22) Filed: Sep. 21, 2004

(65) Prior Publication Data

US 2005/0112850 A1   May 26, 2005

Related U.S. Application Data

(62) Division of application No. 10/107,592, filed on Mar. 28, 2002, now Pat. No. 6,855,584.

(30) Foreign Application Priority Data

| Mar. 29, 2001 | (JP) | ............................. 2001-097226 |
| Apr. 27, 2001 | (JP) | ............................. 2001-133220 |
| Sep. 27, 2001 | (JP) | ............................. 2001-296087 |

(51) Int. Cl.
*H01L 21/84* (2006.01)

(52) U.S. Cl. ...................................... 438/166; 438/476

(58) Field of Classification Search ................ 438/166, 438/151, 155, 491, 149, 154, 487, 486, 476, 438/161
See application file for complete search history.

(56) References Cited

U.S. PATENT DOCUMENTS

| 5,244,819 A | 9/1993 | Yue |
| 5,352,291 A | 10/1994 | Zhang et al. |
| 5,529,937 A | 6/1996 | Zhang et al. |
| 5,578,520 A | 11/1996 | Zhang et al. |
| 5,643,826 A | 7/1997 | Ohtani et al. |
| 5,789,284 A | 8/1998 | Yamazaki et al. |
| 5,861,337 A | 1/1999 | Zhang et al. |
| 5,960,323 A | 9/1999 | Wakita et al. |
| 6,027,960 A | 2/2000 | Kusumoto et al. |
| 6,048,588 A | 4/2000 | Engelsberg |
| 6,072,194 A | 6/2000 | Wakita et al. |
| 6,096,581 A | 8/2000 | Zhang et al. |

(Continued)

FOREIGN PATENT DOCUMENTS

JP         07-183540         7/1995

(Continued)

OTHER PUBLICATIONS

K. Suga et al., "The Effect of a Laser Annealing Ambient on the Morphology and TFT Performance of Poly-Si Films," SID 00 Digest, pp. 534-537.

*Primary Examiner*—Ha Nguyen
*Assistant Examiner*—Walter L. Lindsay, Jr.
(74) *Attorney, Agent, or Firm*—Eric J. Robinson; Robinson Intellectual Property Law Office

(57) ABSTRACT

After crystallization of a semiconductor film is performed by irradiating first laser light (energy density of 400 to 500 mJ/cm$^2$) in an atmosphere containing oxygen, an oxide film formed by irradiating the first laser light is removed. It is next performed to irradiate second laser light under an atmosphere that does not contain oxygen (at a higher energy density than that of the first laser light irradiation), thus to increase the flatness of the semiconductor film.

13 Claims, 23 Drawing Sheets

U.S. PATENT DOCUMENTS

| | | |
|---|---|---|
| 6,162,667 A | 12/2000 | Funai et al. |
| 6,242,292 B1 | 6/2001 | Yamazaki et al. |
| 6,300,176 B1 | 10/2001 | Zhang et al. |
| 6,348,369 B1 | 2/2002 | Kusumoto et al. |
| 6,436,745 B1 | 8/2002 | Gotou et al. |
| 6,559,036 B1 | 5/2003 | Ohtani et al. |
| 6,706,568 B1 | 3/2004 | Nakajima |
| 6,855,584 B1 * | 2/2005 | Yamazaki et al. .......... 438/166 |
| 6,906,344 B1 * | 6/2005 | Yamazaki et al. ............ 257/66 |

FOREIGN PATENT DOCUMENTS

JP    2001-060551    3/2001

* cited by examiner

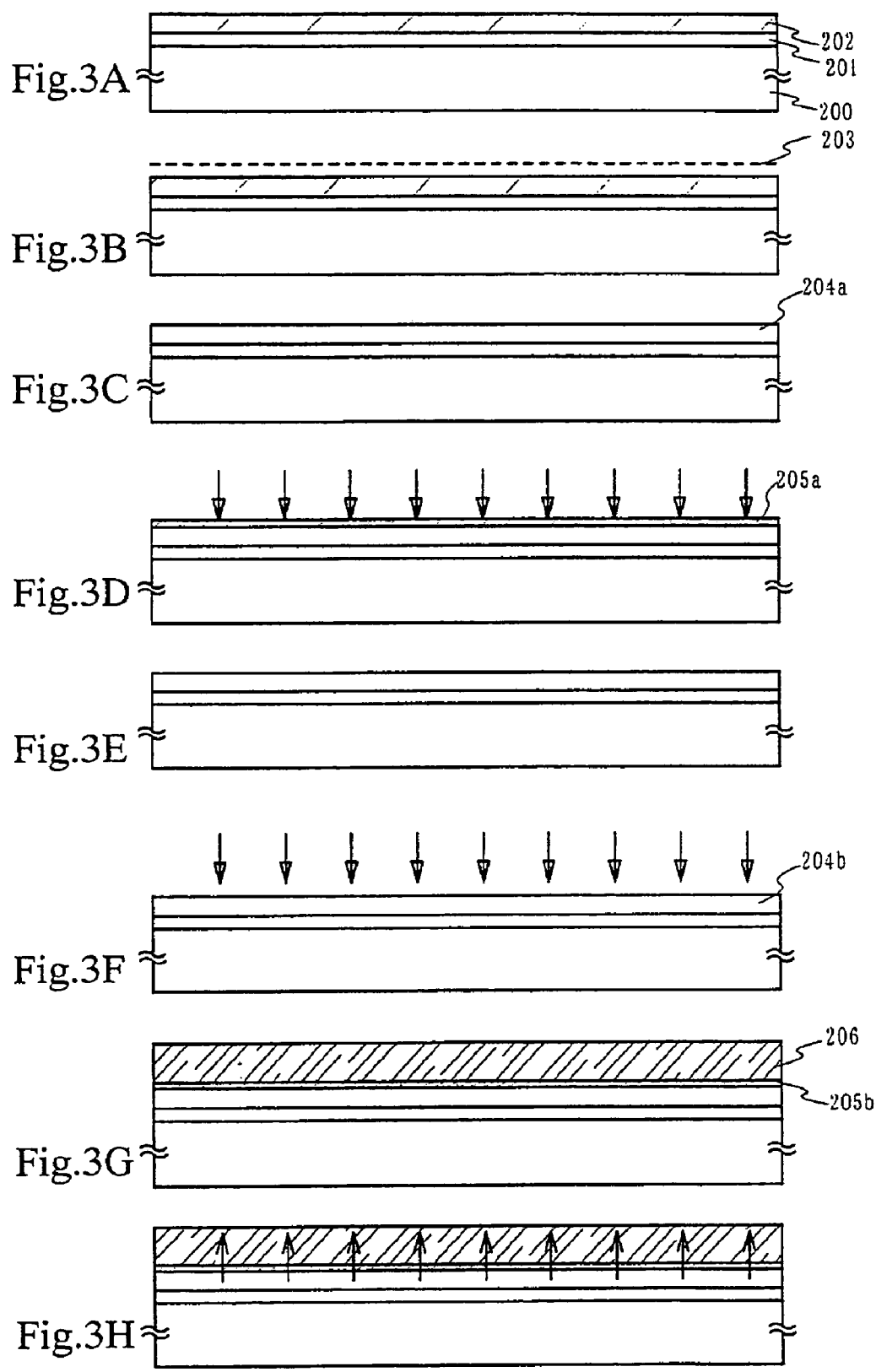

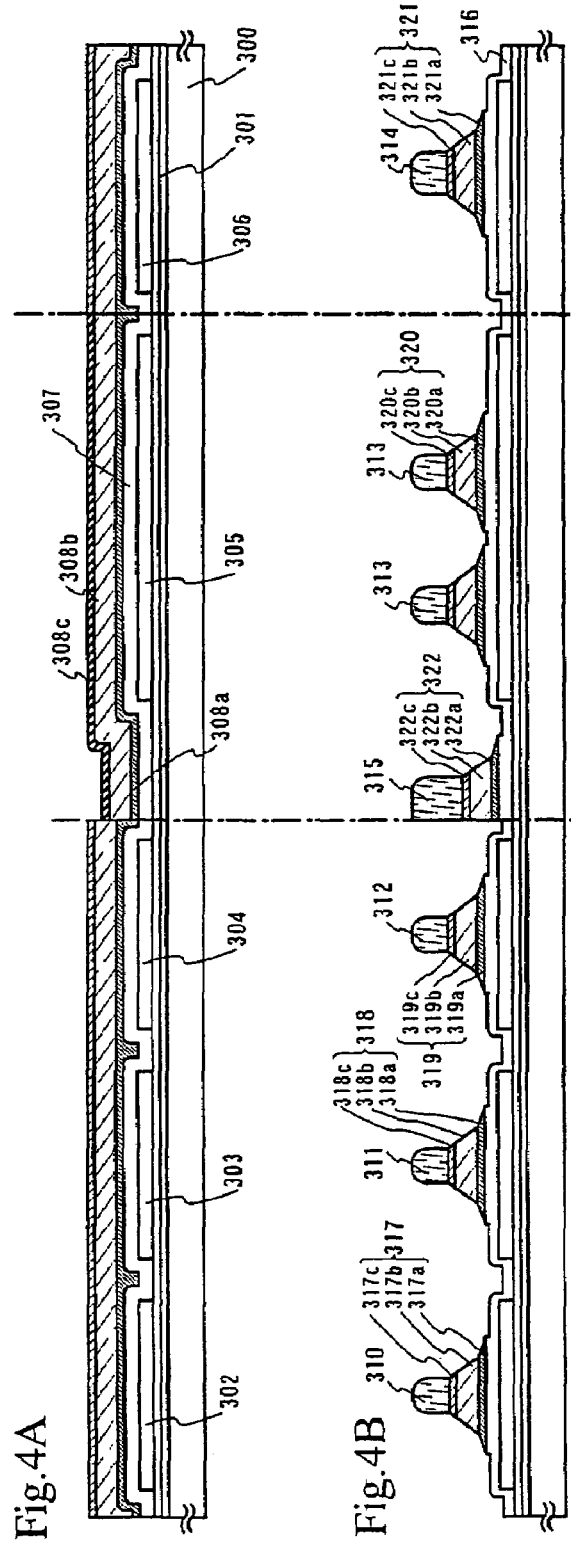

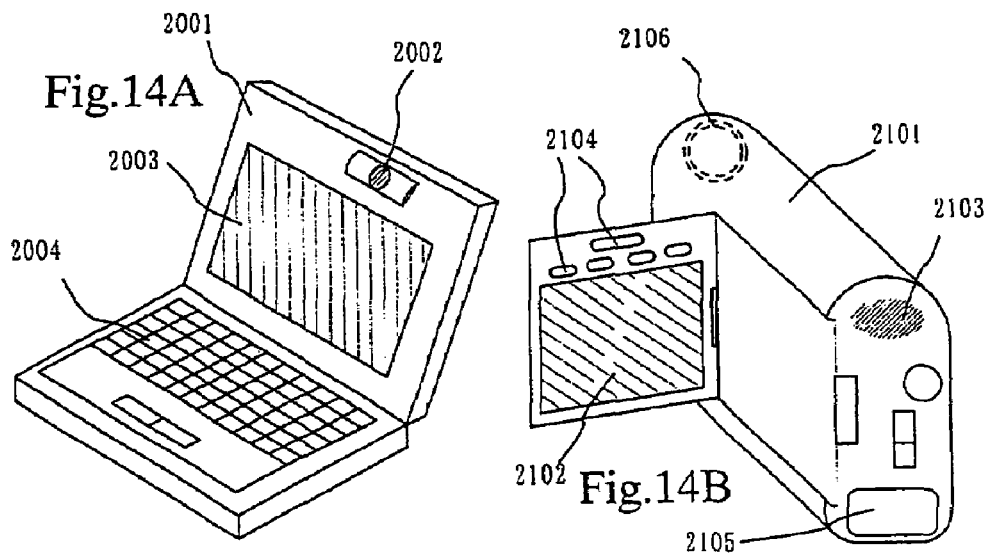
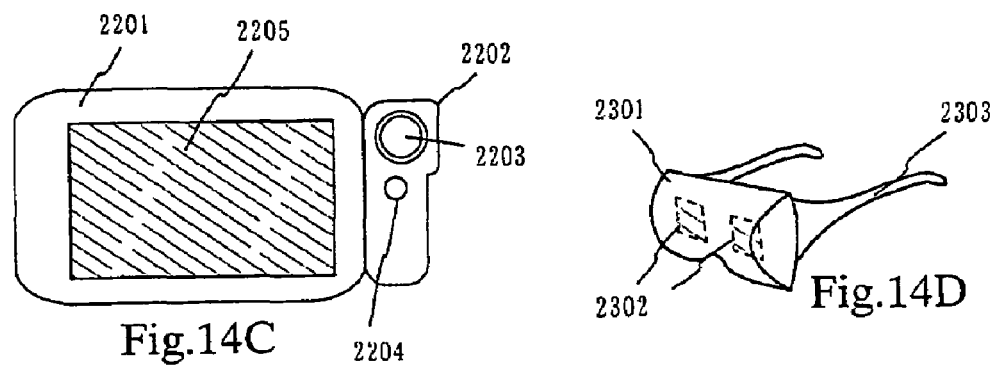
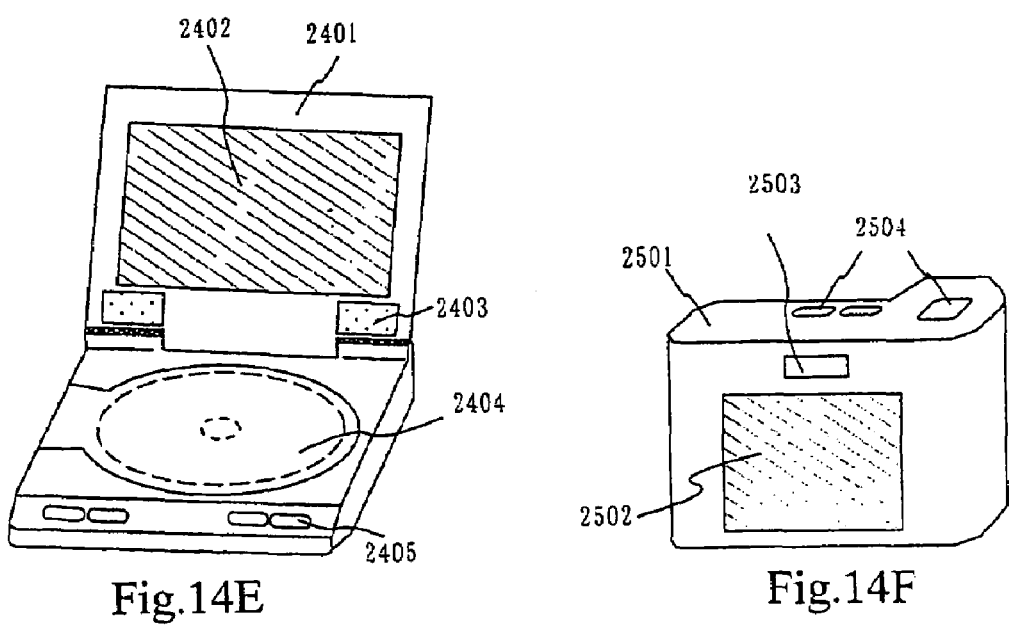
Fig.14A Fig.14B Fig.14C Fig.14D Fig.14E Fig.14F

METHOD OF MANUFACTURING A SEMICONDUCTOR DEVICE

BACKGROUND OF THE INVENTION

1. Field of the Invention

The present invention relates to a semiconductor device which has circuits structured by thin film transistors (hereafter referred to as TFTs), and to a method of manufacturing the semiconductor device. For example, the present invention relates to an electro-optical device, typically a liquid crystal display panel, and to electronic equipment in which this type of electro-optical device is installed as a part.

Note that, in the specification, the term, semiconductor device, indicates a category of general devices which are capable of functioning by utilizing semiconductor characteristics, and electro-optical devices, semiconductor circuits, and electronic equipment are all included in the category of semiconductor devices.

2. Description of the Related Art

Development of a semiconductor device, which has a large surface area integrated circuit formed by thin film transistors (TFTs) structured by using semiconductor thin films (thickness on the order of several nm to several hundred nm) formed on a substrate with an insulating surface, has been advancing in recent years.

Active matrix liquid crystal modules, EL modules, and adhesion type image sensors are known as typical examples. In particular, TFTs using a silicon film with a crystalline structure (typically a polysilicon film) as an active layer (such TFTs are hereafter referred to as polysilicon TFTs) have a high electric field mobility, and therefore it is possible to use these TFTs to form circuits with various kinds of functionality.

For example, a display portion for performing image display every function block, and driver circuits for controlling the pixel portion and including CMOS circuits as shift register circuits, level shifter circuits, buffer circuits, and sampling circuits, are all formed on one substrate for liquid crystal modules installed in liquid crystal display devices.

Furthermore, a TFT (pixel TFT) is disposed in each of several hundred thousand to several million pixels in a pixel portion of an active matrix liquid crystal module, and a pixel electrode is formed in the pixel TFT. An opposing electrode is formed on an opposing substrate side across liquid crystals to form a kind of capacitor having the liquid crystals as dielectrics. There is a mechanism in which a voltage applied to each pixel is controlled by the switching function of the TFT and the liquid crystals are driven by controlling the electric charge to the capacitor, to control the amount of light transmitted and display an image.

The pixel TFT is composed of an n-channel TFT, which applies a voltage to the liquid crystals as a switching element, to drive the liquid crystals. The liquid crystals are driven by alternating current, and therefore a method referred to as frame inversion drive is often employed. In order to suppress electric power consumption with this method, it is necessary that the value of the off electric current of the pixel TFT (the drain current that flows when the TFT is in off operation) is sufficiently reduced.

Conventionally, a semiconductor film is instantaneously melted from the surface side in the case of irradiating laser light to the semiconductor film in order to increase crystallization. Then, heat transfer to a substrate then occurs, and the melted semiconductor film cools and solidifies from the substrate side. Recrystallization occurs during the solidification process to form a semiconductor film with a large grain size crystalline structure. There is temporary melting, however, and volume expansion occurs to form unevenness in the surface of the semiconductor film referred to as ridges. In particular, the surface with ridges in a top gate TFT becomes an interface with a gate insulating film, and thereby the element characteristics are greatly influenced.

In general, lasers often used in laser annealing are excimer lasers and Ar lasers. A method, in which a pulse emission laser beam with high output is processed by using an optical system on a surface to be a rectangular spot which is several cm square, or into a linear shape, for example, with a length equal to or greater than 10 cm, and then the irradiation position of the laser beam is scanned relatively to the surface to be irradiated, is preferably used because the high productivity and the superiority for mass production. In particular, if a laser beam with a linear shape (hereafter referred to as a linear shape beam) in the surface to be irradiated is used, the entire surface to be irradiated can be irradiated by scanning only in a direction perpendicular to the longitudinal direction of the linear laser beam, compared to a case of using a spot shape laser beam in which front and back, and left and right scanning is necessary. Productivity is thus high. Scanning in a direction perpendicular to the longitudinal direction is performed because the scanning direction has the highest efficiency. The use of linear shape beams, for which high output lasers are processed using suitable optical systems, in laser annealing is coming more and more into the mainstream due to their high productivity. Further, by irradiating the linear shape laser beam while gradually shifting in the short side direction and overlapping, laser annealing with respect to the entire surface of the amorphous silicon film can be performed. Crystallization can be performed, and crystallinity can be increased.

Laser annealing techniques are thus indispensable in manufacturing semiconductor films possessing higher electrical characteristics at lower cost.

However, a uniform amount of energy is not imparted over the entire film with crystallization performed by using conventional laser light, and in addition to ridges, wave shaped traces where laser light has been irradiated also remain.

SUMMARY OF THE INVENTION

The present invention is a technique for solving this type of problem. An object of the present invention is to increase the operational characteristics of a semiconductor device, to reduce dispersion between TFTs, and to make the semiconductor device have low electric power consumption, in electro-optical devices, typically active matrix liquid crystal display devices manufactured using TFTs, and semiconductor devices.

In particular, an object of the present invention is to lower the value of the off electric current and obtain pixel TFTs (n-channel TFTs) in which dispersion is suppressed.

In order to solve the aforementioned problems, when many experiments and considerations were performed from several angles, it can be seen that the above problems can be solved, in particular, the off electric current value can be reduced, by increasing the levelness of semiconductor films using the present invention as follows: performing heat treatment to crystallize a semiconductor film with an amorphous structure; irradiating a first laser light to the semiconductor film under an atmosphere containing oxygen (energy density between 400 and 500 mJ/cm$^2$), thus to increase crystallinity; removing an oxide film formed by the first laser light irradiation; and next performing irradiation of a second laser light under an atmosphere that does not contain oxygen (at an energy density higher than that of the first laser light irradiation).

However, while there is a technique (Japanese Patent Application Laid-open No. 2001-60551) in which crystallization of a film having an amorphous structure is performed by a first laser light and then leveling is performed by a second laser light, the present invention is one in which the first laser light is irradiated to a semiconductor film having a crystalline structure. With the present invention, a semiconductor film having a crystalline structure can be obtained by using any of the following methods: a method of crystallization by heat treatment using an oven; a method of crystallization by heat treatment using strong light from a lamp light source; a method of crystallization by adding a small amount of a metallic element and then performing heat treatment; or a method of obtaining a film having a crystalline structure at the film formation state by a method such as LPCVD.

If irradiation of the second laser light is performed at an energy density from 30 mJ/cm$^2$ to 60 mJ/cm$^2$ higher than the energy density of the first laser light irradiation for increasing crystallinity (i.e. between 430 and 560 mJ/cm$^2$), the levelness can be greatly increased compared to that before laser light irradiation. For example, the surface roughness (P-V value, Ra, Rms) can be reduced to ½ or to ⅓ of the original value before irradiation. The surface of a semiconductor film irradiated with the second laser light with an energy density value which is 60 mJ/cm$^2$ higher than that of the first laser light was found to produce the highest levelness in a comparative experiment.

A plot of the statistical data distribution of values of the off electric current (Vds=14 V) of n-channel TFTs manufactured using semiconductor films in which an oxide film is removed after performing the first laser light irradiation and then the second laser light irradiation is performed, is shown in FIG. 12 by light circles (○). Further, for comparison, a plot of the statistical data distribution of values of the off electric current of n-channel TFTs for which only the first laser light irradiation is performed is similarly shown in FIG. 12 by dark circles (●). The vertical axis shows percent in FIG. 12, and a value at 50% corresponds to an average value of the off electric current. Further, the horizontal axis shows the value of the off electric current. For example, the region that all the plots occupies, that is the size in the horizontal direction, becomes larger as the dispersion increases. It can be seen from FIG. 12 that the values of the off electric current are lower (the average value is also lower) for the n-channel TFTs that have undergone the second laser light irradiation (light circles) than for the n-channel TFTs that have only undergone the first laser light irradiation (dark circles). It can also be seen that the dispersion is small, between 3 pA and 20 pA (where p=10$^{-12}$).

Furthermore, a semiconductor film with a crystalline structure, which has good characteristics, can be obtained if a technique for reducing the time required for crystallizing an amorphous semiconductor film is used, in which a small amount of metallic element such as nickel, palladium, or lead is added (disclosed in Japanese Patent Application Laid-open No. Hei 7-183540), for example, if heat treatment for 4 hours at 550° C. in a nitrogen atmosphere is performed. Not only is this technique effective in reducing the heat treatment temperature necessary for crystallization, it is also possible to increase the unidirectionality of the crystal orientation arrangement. Not only is the electric field effect mobility increased if TFTs are manufactured using semiconductor films having this type of crystalline structure, but it is also possible to make the subthreshold coefficient (S value) smaller and to increase the electrical characteristics by leaps and bounds. In addition, if laser annealing is performed, there are cases in which the characteristics of the semiconductor film are increased more than cases in which crystallization is performed using only heat treatment or laser annealing alone. This laser annealing can be performed as irradiation of the first laser light, removing an oxide film, and then irradiating the second laser light. Note that it is necessary to optimize heat treatment conditions and laser annealing conditions in order to obtain good characteristics.

Further, leveling is additionally achieved by adding a small amount of a metallic element such as nickel, palladium, or lead.

Control of the generation of nuclei during crystallization becomes possible by using a metallic element for promoting crystallization, and therefore the film quality obtained is more uniform compared to that by another crystallization method in which nuclei generation is random. Ideally, it is preferable that the metallic element be completely eliminated, or reduced in concentration to an allowable range. However, the metallic element (such as nickel, palladium, or lead) remains in the semiconductor film with the crystalline structure thus obtained. Even if the metallic element is distributed uniformly through the film, it will remain on average at a concentration exceeding $1 \times 10^{19}$/cm$^3$. It is of course possible to form all types of semiconductor elements, such as TFTs, in this state, but the metallic element is removed using a gettering technique shown below.

First, an oxide film that becomes an etching stopper (barrier layer) is formed on a semiconductor film having a crystalline structure. A semiconductor film containing an inert gas element (gettering sites) is then formed, the metallic element is gettered to the gettering sites, and the semiconductor film containing the inert gas element is removed. Note that the inert gas element is one element, or a plurality of elements, selected from the group consisting of He, Ne, Ar, Kr, and Xe, dangling bonds and lattice distortions are formed by making the semiconductor film containing ions of the inert gas element, and gettering sites can thus be formed. In this specification, the term barrier layer indicates a layer having a film quality or a film thickness through which the metallic element is capable of passing during gettering, and which becomes an etching stopper during a process for removing the gettering site layer.

The gettering effect can be increased by irradiating the second laser light before forming the oxide film for increasing levelness in applying this gettering technique. In other words, it is extremely effective to irradiate the second laser light before gettering to perform leveling and reduce ridges in which the metallic element easily segregates. One structure of the present invention is a method of manufacturing a semiconductor device, the method has a step of performing gettering after performing a leveling process of the semiconductor film.

Furthermore, levelness is increased by irradiating the second laser light after adding the metallic element for performing crystallization.

Experimental results of measuring the surface roughness (P-V value, Ra, Rms, Rz, and Δa), using AFM, in a semiconductor film after performing the first laser light irradiation, and then after performing the second laser light irradiation, are shown in FIG. 20 and in Table 1.

TABLE 1

|  | P-V value (nm) | | Ra value (nm) | | Rms (nm) | | Rz (nm) | Δa |
| --- | --- | --- | --- | --- | --- | --- | --- | --- |
| AFM measurement area (μm) | 4 × 4 | 50 × 50 | 4 × 4 | 50 × 50 | 4 × 4 | 50 × 50 | 4 × 4 | 4 × 4 |
| After first laser light irradiation | 91.32 | 102.38 | 10.49 | 8.32 | 12.97 | 10.21 | 68.4 | 2.273° |
| After second laser light irradiation | 20.23 | 36.45 | 2.14 | 1.29 | 2.61 | 1.73 | 18 | 0.504° |

Further, FIG. 20 is a diagram showing observation by AFM of samples for which nickel is added to perform crystallization, irradiation of the first laser light (energy density: 452.5 mJ/cm$^2$) is performed in the air, and irradiation of the second laser light (energy density: 501 mJ/cm$^2$) is performed under a nitrogen atmosphere.

For comparison, experimental results of measurements by AFM of the surface roughness (P-V value, Ra, Rms, Rz, and Δa) in a semiconductor film after crystallization without adding a metallic element the first laser light irradiation, and after the second laser light irradiation, are shown in FIG. 21 and in Table 2.

TABLE 2

|  | P-V value (nm) | | Ra value (nm) | | Rms (nm) | | Rz (nm) | Δa |
| --- | --- | --- | --- | --- | --- | --- | --- | --- |
| AFM measurement area (μm) | 4 × 4 | 50 × 50 | 4 × 4 | 50 × 50 | 4 × 4 | 50 × 50 | 4 × 4 | 4 × 4 |
| After first laser light irradiation | 79.59 | 81.12 | 11.09 | 8.64 | 13.36 | 10.38 | 68.4 | 1.981° |
| After second laser light irradiation | 30.78 | 110.65 | 2.92 | 1.74 | 3.57 | 2.28 | 21.9 | 0.77° |

Further, FIG. 21 is a diagram showing observation by AFM of samples for which irradiation of the first laser light (energy density: 452.5 mJ/cm$^2$) is performed in the air to perform crystallization, and irradiation of the second laser light (energy density: 521 mJ/cm$^2$) is performed under a nitrogen atmosphere.

From Table 1 and Table 2, it can be seen that the process of adding the metallic element and then performing crystallization gives superior levelness after laser light irradiation. In particular, extreme levelness is found after performing the second laser light irradiation. The P-V value is 20.23 nm, Ra is 1.29 nm, Rms is 1.73 nm, Rz is 18 nm, and Δa is 0.504°. Note that measurements were performed with regions having dimensions of 4 μm×4 μm, and 50 μm×50 μm used as measurement regions.

It is disclosed in Japanese Patent Application Laid-open No. 2001-60551 that crystallization of a film is performed by a first laser light, and then leveling is performed by a second laser light irradiation. However, increased levelness by adding a metallic element and increased gettering power are not disclosed. The present invention is thus completely novel.

Further, from FIG. 20 and FIG. 21, the states of the semiconductor film surfaces are each different.

There are no particular limitations on the above stated structure of the present invention (leveling before gettering). The gettering effect can be increased by performing gettering after performing leveling using a leveling means other than irradiation of the second laser light (such as etching using an etchant liquid or a reaction gas (typically dry etching), heat treatment at high temperature (from 900 to 1200° C.) in a reducing atmosphere (typically hydrogen), or chemical or mechanical polishing processing (typically CMP)). Furthermore, leveling may also be performed by the second laser light irradiation in combination with one of the aforementioned methods.

Alternatively, leveling may also be increased by applying a gettering technique, removing an oxide film used as an etching stopper, and then irradiating the second laser light. Furthermore, the amount of an inert gas element within the crystalline structure semiconductor film can be reduced or removed by irradiating the second laser light if the inert gas element is added to the crystalline structure semiconductor film during formation of the semiconductor film containing the inert gas element.

A first structure of the present invention disclosed in this specification is a method of manufacturing a semiconductor device, having: a first step of forming a semiconductor film having an amorphous structure on an insulating film; a second step of performing heat treatment of the semiconductor film and performing irradiation of first laser light to perform crystallization, and forming a semiconductor film having a crystalline structure and forming an oxide film on the semiconductor film having the crystalline structure; a third step of removing the oxide film; and a fourth step of irradiating second laser light under an inert gas atmosphere or in a vacuum to level the surface of the semiconductor film having the crystalline structure.

In the first structure of the present invention, the energy density of the second laser light in the fourth step is higher than the energy density of the first laser light in the second step. If the second laser light irradiation is performed at an energy density that is 30 mJ/cm$^2$ to 60 mJ/cm$^2$ higher than the energy density in the first laser light irradiation, the levelness will increase significantly compared to the levelness before irradiation.

A second structure of the present invention is a method of manufacturing a semiconductor device, having: a first step of forming a first semiconductor film having an amorphous structure on an insulating surface; a second step of adding a metallic element to the first semiconductor film; a third step of performing heat treatment of the first semiconductor film and performing irradiation of first laser light thus to form a first semiconductor film having a crystalline structure and an oxide film on the first semiconductor film having the crystalline structure; a fourth step of performing oxidation of the surface of the first semiconductor film having the crystalline structure by using a solution containing ozone; a fifth step of forming a second semiconductor film containing an inert gas element on the oxide film; a sixth step of gettering the metallic element into the second semiconductor film thus to remove the metallic element from or reduce the concentration of the metallic element in the first semiconductor film having the crystalline structure; a seventh step of removing the second semiconductor film; an eighth step of removing the oxide film; and a ninth step of irradiating second laser light under an inert gas atmosphere or in a vacuum to level the surface of the first semiconductor film.

The amount of time needed for crystallization can be reduced or the heat treatment temperature needed for crystallization can be reduced by using a metallic element for promoting the crystallization of silicon, as in the second structure of the present invention. Performing irradiation of the second laser light after gettering, to perform leveling and thus reduce the amount of the inert gas element within the first semiconductor film, is extremely effective.

In the second structure of the present invention, the sixth step is one in which thermal processing performed using an oven, or irradiation of strong light to the semiconductor film, or both of the thermal processing and the irradiation of strong light to the semiconductor film.

Note that the strong light is light emitted from a halogen lamp, a metal halide lamp, a xenon arc lamp, a carbon arc lamp, a high pressure sodium lamp, or a high pressure mercury lamp.

Further, in the second structure of the present invention the energy density of the second laser light in the ninth step is higher than the energy density of the first laser light in the third step.

A third structure of the present invention is a method of manufacturing a semiconductor device, having: a first step of forming a first semiconductor film having an amorphous structure on an insulating surface; a second step of adding a metallic element to the first semiconductor film having the amorphous structure; a third step of performing heat treatment of the first semiconductor film and then performing irradiation of first laser light to thus perform crystallization, and forming a first semiconductor film having a crystalline structure and an oxide film on the first semiconductor film having the crystalline structure; a fourth step of removing the oxide film; a fifth step of irradiating laser light under an inert gas atmosphere or in a vacuum to level the surface of the first semiconductor film having the crystalline structure; a sixth step of forming a barrier layer on the surface of the first semiconductor film having the crystalline structure; a seventh step of forming a second semiconductor film containing an inert gas element on the barrier layer; an eighth step of gettering the metallic element into the second semiconductor film to remove the metallic element from or reduce the concentration of the metallic element in the crystalline first semiconductor film; and a ninth step of removing the second semiconductor film.

Further, the amount of time needed for crystallization can be reduced or the heat treatment temperature needed for crystallization can be reduced by using a metallic element for promoting the crystallization of silicon, as in the third structure of the present invention. Performing irradiation of the second laser light before gettering to perform leveling thus and reduce ridges in which the metallic element easily segregates, is extremely effective.

In the third structure of the present invention, the sixth step of forming a barrier layer may be a step of oxidizing the surface of the first semiconductor film having the crystalline structure by using a solution containing ozone, or a step of oxidizing the surface of the first semiconductor film having the crystalline structure by irradiating ultraviolet rays, or a step of oxidizing the surface of the first semiconductor film having the crystalline structure by irradiating laser light and additionally oxidizing the surface of the first semiconductor film having the crystalline structure by using a solution containing ozone, or a combination of these steps.

In the third structure of the present invention, the eighth step is one in which thermal processing performed using an oven, or irradiation of strong light to the semiconductor film, or thermal processing and then irradiation of strong light to the semiconductor film are both performed.

Note that the strong light is light emitted from a halogen lamp, a metal halide lamp, a xenon arc lamp, a carbon arc lamp, a high pressure sodium lamp, or a high pressure mercury lamp.

Furthermore, the inert gas atmosphere in any one of the first to third structures of the present invention is a nitrogen atmosphere.

The heat treatment in the third step of the second structure or the third structure of the present invention is thermal processing or irradiation of strong light.

In the second structure or the third structure of the present invention, the second semiconductor film is formed by sputtering using a semiconductor as a target in an atmosphere containing an inert gas element. Further, the second semiconductor film may also be formed by forming a semiconductor film using plasma CVD or reduced pressure thermal CVD, and then adding an inert gas element to the semiconductor film. In addition, the second semiconductor film containing an inert gas element may also be formed directly by plasma CVD or reduced pressure thermal CVD.

In the second structure or the third structure of the present invention, the second semiconductor film may also be formed by sputtering using a semiconductor target containing phosphorous or boron in an atmosphere containing an inert gas element.

The metallic element in the second or the third structure of the present invention is an element, or a plurality of elements, selected from the group consisting of Fe, Ni, Co, Ru, Rh, Pd, Os, Ir, Pt, Cu, and Au. Among these, Ni is optimal for promoting the crystallization of silicon.

The inert gas element in the second structure or the third structure of the present invention is an element, or a plurality of elements, selected from the group consisting of He, Ne, Ar, Kr, and Xe. Among these, the low cost gas Ar is optimal.

The laser light may also be selectively irradiated in an inert gas atmosphere or in a vacuum in any one of the first to third structures according to the present invention. For example, in the case of forming a pixel portion and driver circuits on the same substrate, leveling may be performed by selectively irradiating laser light only to the pixel portion, where reduction of the off electric current and dispersions are seen as important, in the inert gas atmosphere or in a vacuum.

Further, gaseous state laser such as excimer laser, solid state laser such as $YVO_4$ laser or YAG laser, or semiconductor laser may be used for the first laser light and the second laser light. The laser emission may be continuous emission or pulse emission, and the shape of the laser beam may be linear, rectangular, circular, or elliptical. The wavelength used may be suitably selected from any of the fundamental harmonic, the second harmonic, and the third harmonic. Furthermore, vertical, horizontal, or diagonal direction scanning may be used as a method of scanning, and in addition, round trip scanning may also be performed.

Leveling can be performed by the irradiation of the second laser light, with no relation to the unevenness in the base film or the substrate. Therefore, even if microscopic debris adheres to the substrate before forming the semiconductor film, the surface of the semiconductor film can be made level by irradiating the second laser light.

BRIEF DESCRIPTION OF THE DRAWINGS

In the accompanying drawings:

FIGS. 3A to 3H are diagrams for explaining Embodiment Mode 2;

FIGS. 4A to 4C are diagrams showing a method of manufacturing an AM-LCD;

FIGS. 14A to 14F are diagrams showing examples of electronic equipment;

DETAILED DESCRIPTION OF THE PREFERRED EMBODIMENTS

Embodiments of the present invention are explained below.

The present invention has: a process of forming a semiconductor film which has an amorphous structure on an insulating surface; a process of adding a metallic element to the semiconductor film for promoting crystallization; a process of performing heat treatment and forming a semiconductor film which has a crystalline structure; a process of irradiating first laser light, in a atmosphere or in an oxygen atmosphere, to improve the crystallinity of the semiconductor film and form an oxide film; a process of removing the oxide film; a process of irradiating second laser light which has a higher energy density than that of the first laser light, for example, from 30 mJ/cm$^2$ to 60 mJ/cm$^2$ higher, in an inert gas atmosphere or in a vacuum, to level the surface of the semiconductor film; and a process of removing or lowering the concentration the metallic element within the crystalline structure semiconductor film by gettering. Note that the process of leveling the surface of the semiconductor film by irradiating the second laser light may also be performed after performing gettering, and may also be performed after patterning the crystalline structure semiconductor film into a desired shape.

Typical TFT manufacturing processes using the present invention are shown briefly below using FIGS. 1A to 3H.

Embodiment Mode 1

Figure 1A:
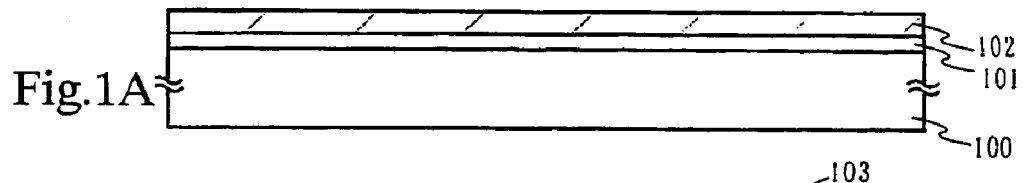
FIGS. 1A to 1G are diagrams for explaining Embodiment Mode 1.
Figure 1B:
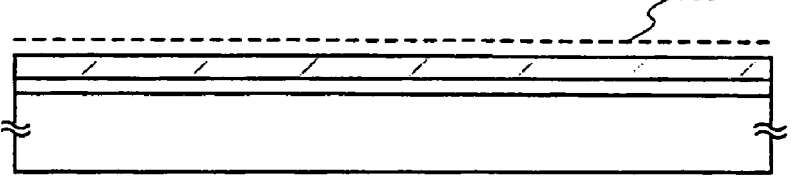

Reference numeral 100 in FIG. 1A denotes a substrate having an insulating surface, reference numeral 101 denotes an insulating film that becomes a blocking layer, and reference numeral 102 denotes a semiconductor film having an amorphous structure.

Substrates such as a glass substrate, a quartz substrate, or a ceramic substrate can be used as the substrate 100 in FIG. 1A. Further, a silicon substrate, a metallic substrate, or a stainless steel substrate, which has an insulating film formed on the surface, may also be used. A plastic substrate may also be used if the heat resistance is able to withstand the processing temperatures in the processes of Embodiment Mode 1.

First, the base insulating film 101 is formed on the substrate 100 from an insulating film such as a silicon oxide film, a silicon nitride film, or a silicon oxynitride film (SiO$_x$N$_y$), as shown in FIG. 1A. A typical example is a two layer structure as the base insulating film 101. The structure is employed, in which a first silicon oxynitride film formed to have a thickness of 50 to 100 nm using SiH$_4$, NH$_3$, and N$_2$O as reaction gas, and a second silicon oxynitride film formed to have a thickness of 100 to 150 nm using SiH$_4$ and N$_2$O as reaction gas are laminated. Further, it is preferable to use a silicon nitride film (SiN film) with a film thickness of 10 nm or less or a second silicon oxynitride film (SiO$_x$N$_y$ film, where x>>y) as one layer of the base insulating film 101. Nickel has a tendency to easily move to regions including oxygen with a high concentration, and therefore it is extremely effective to use a silicon nitride film as the base insulating film that contacts the semiconductor film. Further, a three layer structure in which a first silicon oxynitride film, a second silicon oxynitride film, and a silicon nitride film are laminated in order may also be used.

The first semiconductor film 102 with an amorphous structure is then formed on the base insulating film. As the first semiconductor film 102, a semiconductor material which has silicon as its main constituent is used. A film such as an amorphous silicon film or an amorphous silicon germanium film is typically applied, and is formed to have a thickness of 10 to 100 nm by plasma CVD, reduced pressure CVD, or sputtering. It is preferable to reduce the concentration of impurities such as oxygen and nitrogen contained in the first semiconductor film 102 to a concentration of $5 \times 10^{18}/cm^3$ or less (atomic concentration measured using secondary ion mass spectrometry, (SIMS)) in order to obtain a semiconductor film with a satisfactory crystalline structure by later crystallizing. These impurity elements cause interference in the later crystallization, and also cause the concentration of capture centers and recombination centers to increase after crystallization. It is therefore desirable to use material gas with high purity and to employ an ultra-high vacuum CVD apparatus in which the inside of its reaction chamber has undergone mirrored surface processing (electrolytic polishing), and which is provided with an oil free vacuum evacuation system.

Crystallization is performed next using the technique disclosed in Japanese Patent Application Laid-open No. Hei 8-78329 as a technique for crystallizing the first semiconductor film 102. The technique in Japanese Patent Application Laid-open No. Hei 8-78329 is that a metallic element for promoting crystallization is selectively added to the amorphous silicon film, and heat treatment is performed. A semiconductor film is thus formed which has a crystalline structure spreading out from the region to which the metallic element is added. First, a nickel acetate solution containing 1 to 100 ppm by weight of a metallic element (nickel is used here) which has a catalytic action for promoting crystallization is applied to the surface of the first semiconductor film 102 by a spinner to form a nickel containing layer 103. (See FIG. 1B.) A means for forming an extremely thin film by sputtering, evaporation, or plasma processing may also be employed as an other means for forming the nickel containing layer 103. Furthermore, although an example in which application is performed over the entire surface is shown here, the nickel containing layer may be formed selectively by forming a mask.

Figure 1C:
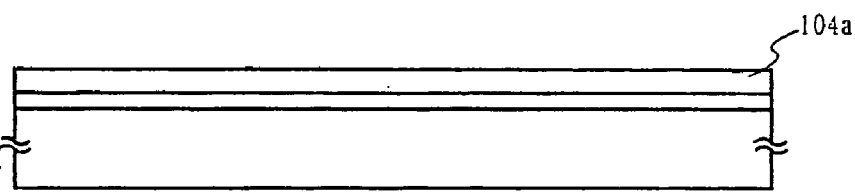
Figure 1D:
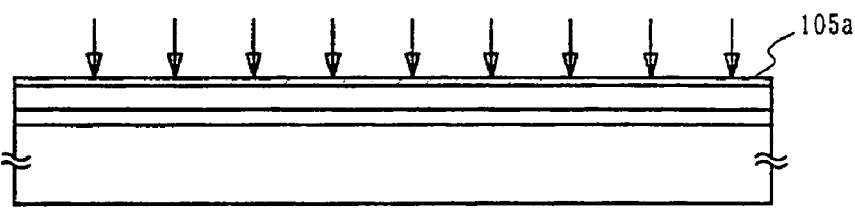

Heat treatment is performed next to perform crystallization. In this case, suicides are formed at portions of the semiconductor film which are in contact with the metallic element that promotes crystallization of semiconductor, and then crystallization proceeds with the silicides acting as nuclei. A first semiconductor film 104a with a crystalline structure is thus formed as shown in FIG. 1C. Note that it is desirable that the concentration of oxygen contained in the first semiconductor film 104a after crystallization be is $5 \times 10^{18}/cm^3$ or less. Heat treatment for dehydrogenation is here performed at 450° C. for one, and then heat treatment for crystallization is performed for 4 to 24 hours at 550 to 650° C. Further, it is possible to use one kind or a plurality of kinds, selected from the group consisting of infrared light, visible light, and ultraviolet light in the case of performing crystallization by irradiating strong light. Light emitted from a halogen lamp, a metal halide lamp, a xenon arc lamp, a carbon arc lamp, a high pressure sodium lamp, or a high pressure mercury lamp is typically used. A light source of a lump may be turned on for 1 to 60 seconds, preferably 30 and 60 seconds, and this operation may be repeated one to 10 times to heat the semiconductor film instantaneously to a temperature on the order of 600 to 1000° C. Note that, if necessary, heat treatment for emitting hydrogen contained in the first semiconductor film 102 may also be performed before irradiating strong light. Furthermore, crystallization may also be performed by using heat treatment and irradiation of strong light at the same time. Considering productivity, it is preferable that crystallization be performed by strong light irradiation.

The metallic element (nickel here) remains in the first semiconductor film 104a thus obtained. Although the metallic element is not distributed uniformly through the film, a concentration exceeding $1 \times 10^{19}/cm^3$ remains on average. It is of course possible to form various types of semiconductor elements such as TFTs even in this state, but the metallic element is removed by a method later.

Laser light (first laser light) is next irradiated to first semiconductor film 104a with the crystalline in an atmosphere or in an oxygen atmosphere, in order to increase crystallinity (proportion of crystalline components to the total volume of the film) and in order to repair defects remaining in crystal grains. Unevenness is formed in the surface and a thin oxide film 105a is formed if laser light (a first laser light) is irradiated. (See FIG. 1D). Continuous emission or pulse emission laser with a wavelength of 400 nm or less, such as excimer laser, YAG laser, $YVO_4$ laser, YLF laser, $YAlO_3$ laser, glass laser, ruby laser, alexandrite laser, or Ti:sapphire laser, can be used for the laser light (the first laser light). Further, light emitted from an ultraviolet light lamp may also be used as a substitute for excimer laser light.

If such laser is employed, a method, in which laser light emitted form a laser oscillator is condensed into a linear shape by an optical system to irradiate the semiconductor film, may be used. Although conditions for crystallization may be suitably set by the operator, the pulse emission frequency is set to 30 Hz and the laser energy density is set from 100 to 400 $mJ/cm^2$ (typically between 200 and 300 $mJ/cm^2$) in the case of using pulse emission excimer laser. Further, the second harmonic or the third harmonic may be utilized if a pulse emission YAG laser or $YVO_4$ laser is used, with the pulse emission frequency set from 1 to 10 kHz and the laser energy density set from 300 to 600 $mJ/cm^2$ (typically, between 350 and 500 $mJ/cm^2$). The laser light, condensed into a linear shape with a width of 100 to 1000 $\mu m$, for example 400 $\mu m$, may then be irradiated over the entire substrate surface with the overlap ratio of the linear shape laser light between 50 and 98%.

Furthermore, in the case of using continuous emission laser, typically $YVO_4$ laser, laser light emitted from continuous emission $YVO_4$ laser with 10 W output is converted into a harmonic (second harmonic to fourth harmonic) by a non-linear optical element. There is also a method in which $YVO_4$ crystals and non-linear optical elements are inserted in a laser oscillator to emit a harmonic. It is preferable to form laser light into a rectangular or elliptical shape over an irradiation surface by an optical system, and then irradiate an object to be processed. It is necessary for the energy density to be set from 0.01 to 100 $MW/cm^2$ (preferably 0.1 to 10 $MW/cm^2$). It is then preferable to irradiate the laser light by relatively moving a semiconductor film to the laser beam at a speed of 0.5 to 2000 cm/s.

Figure 1E:
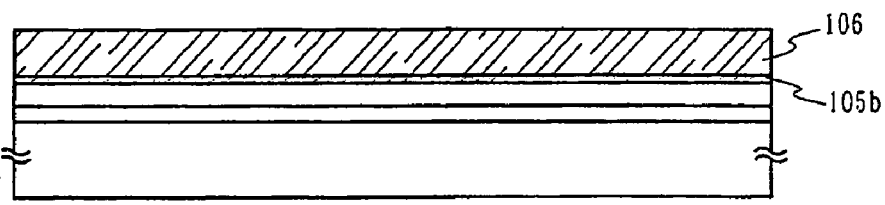

In addition, an oxide film (referred to as a chemical oxide film) is formed by using an ozone containing aqueous solution (typically ozone water) to form a barrier layer 105b of an oxide film with a total thickness of 1 to 10 nm. Then, a second semiconductor film 106 containing an inert gas element is formed on the barrier layer 105b (FIG. 1E). Note that the oxide film 105a formed in irradiating laser light is to the first semiconductor film 104a with the crystalline structure, is also considered to be a portion of the barrier layer here. The barrier layer 105b functions as an etching stopper in selectively removing the second semiconductor film 106 alone later. Further, the chemical oxide can also be formed similarly by processing with an aqueous solution in which an acid such as sulfuric acid, hydrochloric acid, or nitric acid is mixed with aqueous hydrogen peroxide as a substrate for the ozone containing aqueous solution. It may also be used as an another method of forming the barrier layer 105b that ozone is generated by irradiating ultraviolet light in an oxygen atmosphere and the surface of the semiconductor film with the crystalline structure is oxidized. In addition, an oxide film with a thickness on the order of 1 to 10 nm may also be deposited as a barrier layer with a method such as plasma CVD, sputtering, or evaporation as an another method for forming the barrier layer 105b.

It is preferable to clean the surface of the semiconductor film with the crystalline structure and then remove films such as a natural oxide film and an oxide film formed in laser irradiation before forming the barrier layer if a method such as plasma CVD, sputtering, or evaporation is used.

Furthermore, silane gas (such as monosilane, disilane, or trisilane) and nitrogen oxide gas (gas denoted by NOx) are used as material gas if plasma CVD is used in forming the barrier layer. For example, a silicon oxynitride film with a thickness equal to or less than 10 nm, preferably equal to or less than 5 nm, is formed by using monosilane ($SiH_4$) and nitrous oxide ($N_2O$), or TEOS gas and $N_2O$, or TEOS gas, $N_2O$ and $O_2$. Compared with oxide films obtained by using an ozone containing aqueous solution (typically ozone water) (referred to as chemical oxides), and oxide films obtained by generating ozone with irradiation of ultraviolet under an oxygen atmosphere and oxidizing the surface of a semiconductor film with a crystalline structure, the silicon oxynitride film formed by plasma CVD has a higher adhesion with the first semiconductor film, and peeling does not occur during the later process (forming the second semiconductor film). A treatment with argon plasma may also be performed before forming the barrier layer in order to additionally enhance the adhesion. Furthermore, a metallic element is able to pass through the barrier layer and migrate to gettering sites in a gettering process, provided that the barrier layer is a silicon oxynitride film within the aforementioned range of the film thickness.

A thin oxide film may also be formed by using a clean oven to heat at a temperature on the order of 200 to 350° C. as another method of forming the barrier layer 105b. Although there are no particular limitations on forming the barrier layer 105b, provided that it is formed by one of, or a combination of, the above stated methods, it is necessary to have a film quality or a film thickness in order that nickel in the first semiconductor film is capable of moving to the second semiconductor film in gettering later.

The second semiconductor film 106 containing the inert gas element is formed by sputtering here to form gettering sites (FIG. 1E). Note that it is preferable that the conditions in sputtering are suitably regulated in order that the inert gas element is not added to the first semiconductor film. One element, or a plurality of elements, selected from the group consisting of helium (He), neon (Ne), argon (Ar), krypton (Kr), and xenon (Xe) are used as the inert gas element. Among these elements, it is preferable to use argon (Ar) which is low cost gas. A target of silicon is used in an atmosphere containing the inert gas element here to form the second semiconductor film. There are two meanings associated with including ions of rare gas element that is inert gas within the film; One is that dangling bonds are formed to impart distortions to the semiconductor film, and the other is that distortions are formed within lattices of the semiconductor film. The distortions within the lattices of the semiconductor film can be obtained remarkably if an element with a greater atomic radius, such as argon (Ar), krypton (Kr), or xenon (Xe) than that of silicon is used. Not only are lattice distortions formed by including the rare gas element within the film, unpaired bonds are also formed to contribute to gettering action.

Furthermore, gettering can be performed utilizing the Coulomb force of phosphorous in addition to gettering with rare gas element, in the case of forming the second semiconductor film by using a target containing phosphorous which is an impurity element with a single conductivity type.

It is preferable that the concentration of oxygen contained in the second semiconductor film 106 be higher than the concentration of oxygen contained in the first semiconductor film, for example equal to or greater than $5 \times 10^{18}/cm^3$, since nickel has a tendency to easily move to regions containing oxygen with a high concentration during gettering.

Figure 1F:
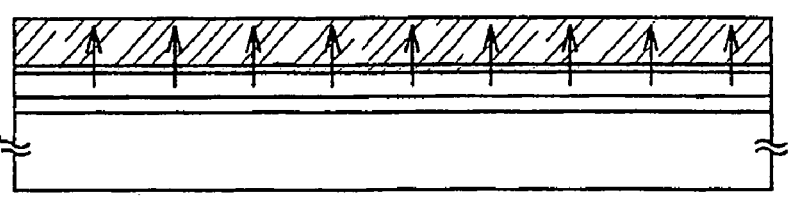

A heat treatment is performed next to perform gettering, for reducing the concentration of the metallic element (nickel) in, or removing the metallic element from, the first semiconductor film (FIG. 1F). A treatment of irradiating strong light or thermal treatment may be performed as the heat treatment. The metallic element moves in the direction of the arrow in FIG. 1F (that is, in the direction from the substrate side toward the surface of the second semiconductor film), to perform removing the metallic element or lowering the concentration of the metallic element, contained in the first semiconductor film 104a covered by the barrier layer 105b. The distance where the metallic element move during gettering may be a distance at least on the order of the thickness of the first semiconductor film, and gettering can be accomplished in a relatively short amount of time. Sufficient gettering is performed in order that all of the nickel is made to move to the second semiconductor film 106 without segregating in the first semiconductor film 104a and that nickel contained in the first semiconductor film 104a hardly exists. That is, gettering is performed so that the concentration of the nickel within the first semiconductor film becomes equal to or less than $1 \times 10^{18}/cm^3$, preferably equal to or less than $1 \times 10^{17}/cm^3$.

Further, there is a case in which the ratio of crystallization in the first semiconductor film can also be enhanced and defects remaining within the crystal grains can be repaired at the same time as gettering in accordance with the conditions of heat treatment for gettering. In other words, the crystallinity can be improved.

In this specification, the term gettering indicates emission of a metallic element from a region to be gettered (the first semiconductor film here) by thermal energy, and movement of the metallic element to gettering sites by diffusion. Accordingly, gettering is dependent upon the processing temperature, and proceeds in a shorter amount of time with higher temperature.

Further, a light source of a lump for heating is turned on for 1 to 60 seconds, preferably for 30 to 60 seconds, and this operation is repeated for 1 to 10 times, preferably between 2 and 6 times, in the case of using a process of irradiating strong light as the heat treatment for gettering. Although the light emission strength of the light source may be set arbitrarily, the semiconductor film made to be instantaneously heated to a temperature of 600 to 1000° C., preferably 700 and 750° C.

In the case of performing thermal treatment, heating may be conducted in a nitrogen atmosphere at a temperature of 450 to 800° C. for 1 to 24 hours, for example, at 550° C. for 14 hours. Strong light may also be irradiated in addition to the thermal treatment.

Next, the second semiconductor film 106 only is selectively removed with using the barrier layer 105b as an etching stopper, and the barrier layer formed of the oxide film 105b is also removed. Dry etching which does not utilize a $ClF_3$ plasma, or wet etching by using an alkaline solution such as hydrazine or an aqueous solution containing tetraethyl-ammonium-hydroxide (chemical formula $(CH_3)_4$ NOH)) can be performed as the method of selectively etching only the second semiconductor film. Further, it is preferable to remove the barrier layer after removing the second semiconductor film since nickel is detected at high concentration on the surface of the barrier layer by measuring the nickel concentration with TXRF. The barrier layer may be removed by an etchant containing hydrofluoric acid.

Figure 1G:
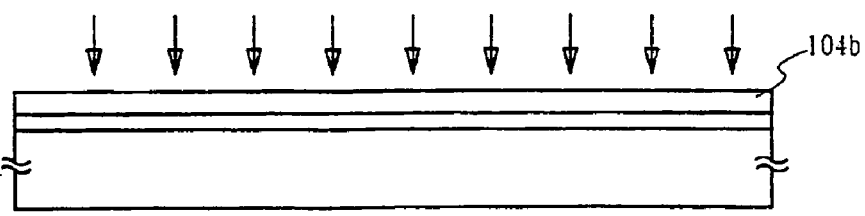

Laser light (a second laser light) is then irradiated to the first semiconductor film with the crystalline structure in a nitrogen atmosphere or in a vacuum. The height difference in the unevenness formed due to the irradiation of the first laser light (peak to valley, P-V: the difference between the maximum value and minimum value of the height) is reduced when the second laser light is irradiated. Namely, leveling is performed (FIG. 1G). The P-V value of the unevenness may be observed by AFM (atomic force microscopy). With AFM, it is possible to measure the center line average roughness (Ra), the root-mean-square value of the roughness (Rms), the ten point average surface roughness (Rz), and the average slope angle ($\Delta a$) as other indicators for showing surface roughness. Specifically, a surface which has an unevenness formed by the irradiation of the first laser light and a P-V value of the unevenness on the order of 80 to 100 nm, can have its P-V value reduced to be equal to or less than 40 nm, preferably equal to or less than 30 nm, by irradiating the second laser light. Furthermore, a surface in which the Ra value is approximately 10 nm can have its Ra value reduced to be equal to or less than 2 nm by irradiating the second laser light. The Rms value can be reduced to be equal to or less than 2 nm by irradiating the second laser light for a surface in which the Rms value is approximately 10 nm. In addition, a surface which has an Rz of approximately 70 nm can have its Rz value reduced to be equal to or less than 20 nm by irradiating the second laser light. Finally, a surface which has a $\Delta a$ value of approximately 2° can have a $\Delta a$ value equal to or less than 1° by irradiating the second laser light.

Note that the above values (P-V value, Ra, Rms, Rz, and $\Delta a$) are values in the case of measuring with an area region which has a surface area of 4 $\mu m \times 4$ $\mu m$, or 50 $\mu m \times 50$ $\mu m$.

Excimer laser light which has a wavelength equal to or less than 400 nm, or the second harmonic or the third harmonic of YAG laser is used for the laser light (the second laser light). Further, light emitted from an ultraviolet light lamp may be used as a substitute for the excimer laser light.

The inventors of the present invention performed the experiment shown below.

Experiment

First, a test piece is prepared with a base insulating film (a silicon oxynitride film with a film thickness of 150 nm) formed on a glass substrate and a 54 nm thick of amorphous silicon film formed on the base insulating film by plasma CVD. A solution containing 10 ppm by weight of nickel is then applied, heat treatment is performed for one hour at 500° C., and further heat treatment is performed at 550° C. for 4 hours to perform crystallization and form a silicon film with a crystalline structure. Next, after the surface of the semiconductor film is cleaned by hydrofluoric acid, first laser light (excimer laser light) is irradiated in a atmosphere or in an oxygen atmosphere. The energy density of the first laser light is set to 476 mJ/cm² here. After removing an oxide film formed during irradiating the first laser light by using hydrofluoric acid, second laser light is irradiated in a nitrogen atmosphere under different conditions of energy densities (476, 507, 537 and 567 mJ/cm²). P-V values are measured to perform a comparison.

Figure 13:
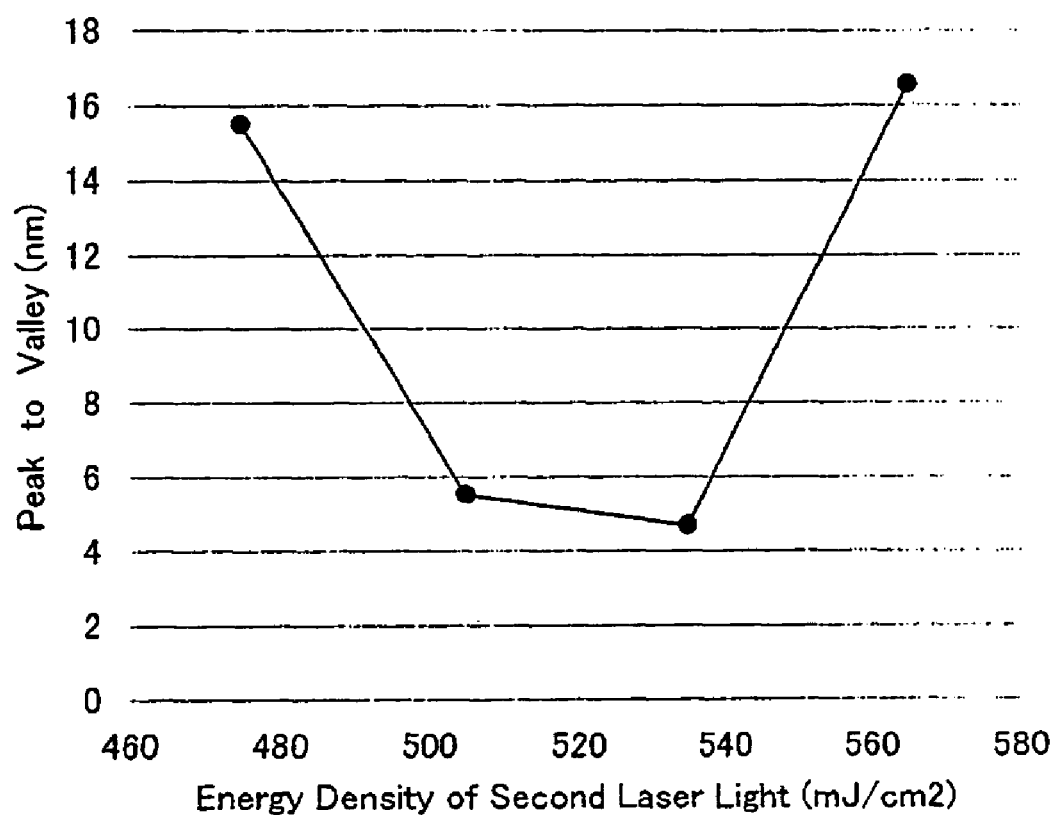
FIG. 13 is a diagram showing the relationship between the energy density of a second laser light and the P-V value.

The experimental results are shown in FIG. 13.

Seen from FIG. 13, the energy density of the second laser light is made larger than the energy density of the first laser light, preferably by 30 to 60 mJ/cm² larger. However, a tendency of deteriorating the properties, that is, increasing surface roughness, falling the crystallinity, or occurring micro-crystallization, can be seen if the energy density of the second laser light is greater than the energy density of the first laser light by an amount equal to or greater than 90 mJ/cm².

Note that although the second laser light has a higher energy density than that of the first laser light, there is almost no change in crystallization before and after irradiating the second laser light. Further, the crystal state, such as grain size, hardly changes, either. In other words, it can be thought that the second laser light only performs leveling.

The merits due to leveling of the semiconductor film with the crystalline structure by the second laser light irradiation are extremely great. Specifically, in accordance with increased levelness, it becomes possible to make later formed gate insulating films thinner and the on current value of TFTs can be increased. Furthermore, it can reduce the off current in the case of manufacturing TFTs to increasing the levelness.

An effect of removing or reducing the inert gas element within the semiconductor film with the crystalline structure by irradiating the second laser light even if the inert gas element is also added to the first semiconductor film in forming gettering sites.

Figure 2A:
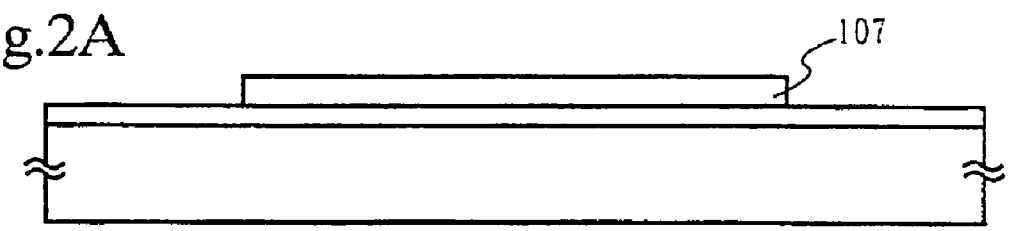
FIGS. 2A and 2B are diagrams for explaining Embodiment Mode 1.

The leveled first semiconductor film 104b is next formed into a semiconductor layer 107 with a desired shape by using a known patterning technique (FIG. 2A). It is preferable to form a thin oxide film on the surface by using ozone water before forming a resist mask.

An insulating film including silicon as its main constituent, which becomes a gate insulating film 108, is then formed next after cleaning the surface of the semiconductor film using an etchant containing hydrofluoric acid. It is preferable to clean the surface and form the gate insulating film in succession, without exposing to the atmosphere.

A gate electrode 109 is formed next after cleaning the surface of the gate insulating film 108. A suitable amount of an impurity element (such as P, or As) that imparts n-type conductivity to semiconductor, phosphorous here, is then added, and a source region 110 and a drain region 111 are formed. Heat treatment, irradiation of strong light, or irradiation of laser light is performed for activating the added impurity element next. Furthermore, plasma damage to the gate insulating film, and plasma damage to the interface between the gate insulating film and the semiconductor layer can be recovered at the same time as the activation. In particular, it is extremely effective to activate the impurity element by irradiating the second harmonic of YAG laser from the front side or from the back side in an atmosphere at a temperature between room temperature and 300° C. YAG laser is preferable means for the activation since low maintenance is necessary.

Figure 2B:
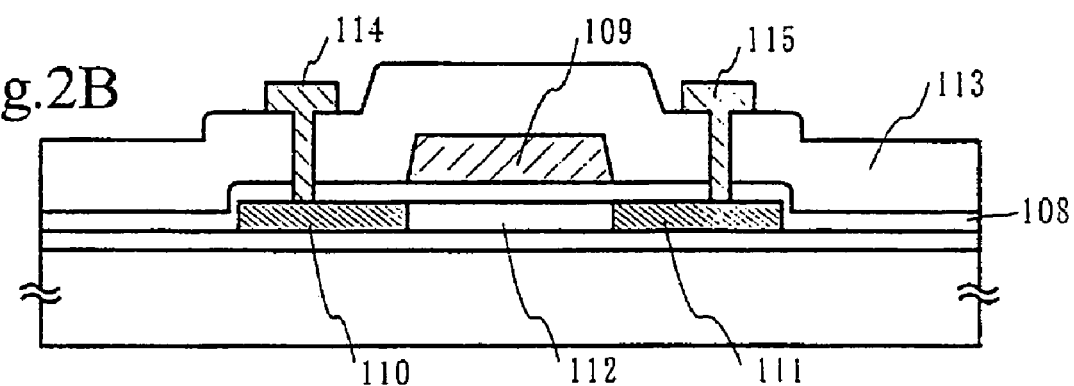

Subsequent processes are as follows: an interlayer insulating film 113 is formed; hydrogenation is performed; contact holes for reaching the source region and the drain region are formed; and a source electrode 114 and a drain electrode 115 are formed, complete a TFT (n-channel TFT) (FIG. 2B).

The concentration of the metallic element contained in a channel forming region 112 of the TFT thus obtained can be made less than $1\times10^{17}/cm^3$. Further, the levelness in the semiconductor surface of the TFT thus obtained is greatly enhanced by the above process, and therefore the value of the off current is reduced, and dispersion in values of the off current is reduced.

The present invention is not limited to the TFT structure of FIG. 2B. A low concentration drain structure, in which there is an LDD (lightly doped drain) region between the channel forming region and a drain region (or a source region), may also be used if necessary. This structure has a region including a low concentration of an impurity element, formed between the channel forming region and the source region or the drain region including a high concentration of the impurity element. This region including the low concentration is referred to as an LDD region. In addition, a GOLD structure (gate-drain overlapped LDD), in which an LDD region is arranged so as to overlap with a gate electrode through a gate insulating film, may also be used.

In addition, although there is the explanation here on an n-channel TFT, a p-channel TFT can, of course, also be formed by using a p-type impurity element as a substitute for the n-type impurity element.

Further, although a top gate TFT is explained here as an example, it is possible to apply the present invention without regarding the TFT structure. For example, it is possible to apply the present invention to bottom gate TFTs (reverse stagger TFTs) and to forward stagger TFTs.

Although an example of performing gettering by utilizing a semiconductor film containing an inert gas is explained here, the present invention is effective without any relation to the gettering method since ridges in which the metallic elements easily segregate can be reduced in accordance with the present invention. For example, it is possible to apply the present invention to a gettering method of forming gettering sites by selectively adding phosphorous and then performing heat treatment, and a similar gettering effect to that of Embodiment Mode 1 can of course be improved.

Furthermore, there may be a case in which a semiconductor layer is formed into a predetermined shape by patterning, and then it is performed to irradiating second laser light in an inert gas atmosphere or in a vacuum to perform leveling after removing an oxide, without irradiating the second laser light before patterning.

Embodiment Mode 2

An example of performing irradiation of the second laser light in different order from that of Embodiment Mode 1 is shown here in FIGS. 3A to 3H.

First, irradiation of first laser light is performed in accordance with Embodiment Mode 1. Note that FIG. 3A corresponds to FIG. 1A, FIG. 3B corresponds to FIG. 1B, FIG. 3C corresponds to FIG. 1C, and FIG. 3D corresponds to FIG. 1D.

Further, within FIGS. 3A to 3H, reference numeral 200 denotes a substrate, reference numeral 201 denotes an insulating film that becomes a blocking layer, reference numeral 202 denotes a semiconductor film with an amorphous structure, reference numeral 203 denotes a nickel containing layer, reference numeral 204a denotes a semiconductor film with a crystalline structure, and reference numeral 205a denotes an oxide film.

The oxide film 205a, formed by irradiation of the first laser light, is removed next (FIG. 3E).

Laser light (second laser light) is then irradiated to the first semiconductor film with the crystalline structure in a nitrogen atmosphere or in a vacuum. The P-V value of the unevenness formed by irradiating the first laser light is reduced when the second laser light is irradiated. Namely, leveling is performed (FIG. 3F). Specifically, a surface with the P-V value of the unevenness on the order of 80 to 100 nm, formed by the irradiating the first laser light, can have its P-V value reduced to become equal to or less than 40 nm, preferably equal to or less than 30 nm, by irradiating the second laser light. Excimer laser light which has a wavelength equal to or less than 400 nm, or the second or third harmonic of YAG laser, is used for the laser light (the second laser light). In addition, light emitted from an ultraviolet light lamp may also be used as a substitute for excimer laser light. Note that the energy density of the second laser light is made larger than the energy density of the first laser light, preferably from 30 to 60 mJ/cm² larger. However, deterioration in the properties, in which crystallinity is reduced or micro-crystallization occurs, is seen if the energy density of the second laser light is greater than the energy density of the first laser light by an amount equal to or greater than 90 mJ/cm².

Note that although the second laser light has a higher energy density than that of the first laser light, there is almost no change in crystallinity before and after irradiating the second laser light. Further, the crystal state, such as grain size, also nearly does not change. In other words, it can be thought that the second laser light only performs leveling.

The merits due to leveling of semiconductor film with the crystalline structure by irradiating the second laser light are extremely large. For example, nickel easily segregates into ridges in later gettering. The effect due to gettering is therefore increased if gettering is performed after leveling the surface in advance by irradiating the second laser light before gettering. Alternatively, the effect due to gettering is increased by diffusion of metallic element, typically nickel element used to promote crystallization, within the semiconductor film, in accordance with the irradiation of the second laser light.

If sufficient gettering is not performed to the substrate and a dispersion in gettering develop, then the characteristics of each TFT will have a small difference, that is, dispersion. If there is a dispersion in the electrical properties of TFTs arranged in a pixel portion of a transmission type liquid crystal display device, then a dispersion in the voltage applied to each pixel electrode will develop and a dispersion in the amount of transmitted light therefore also will develop. In the result, display irregularities are seen by an observer. The present invention can resolve these problems.

It becomes possible to make later formed gate insulating films thinner and the on current value of a TFT can be increased in accordance with increased levelness. Furthermore, increased levelness can reduce the off current in the case of manufacturing TFTs.

An oxide film (referred to as a chemical oxide film) is formed next by using an ozone containing solution (typically ozone water), to form a barrier layer 205b of an oxide film with a thickness of 1 to 10 nm. A second semiconductor film 206 containing a rare gas element is formed on the barrier layer 205b (FIG. 3G).

Ozone may be generated by irradiating ultraviolet rays under an oxygen atmosphere to oxidize the surface of the semiconductor film with the crystalline structure, as an another method of forming the barrier layer 205b. In addition, an oxide film as the barrier layer may also be deposited to have a thickness on the order of 1 to 10 nm with a method such as plasma CVD, sputtering, or evaporation, as another method of forming the barrier layer 205b. Further, a thin oxide film may also be formed by heating with a clean oven at a temperature on the order of 200 to 350° C., as an another method of forming the barrier layer 205b. Note that there are no particular limitations on a method of forming the barrier layer 205b, provided that it is formed by one of, or a combination of, the above stated methods. However, the barrier layer 205b needs to have a film quality or a film thickness in order that nickel within the first semiconductor film is capable of moving to the second semiconductor film by later gettering.

The second semiconductor film 206 including a rare gas element is formed by sputtering here to form gettering sites. One element, or a plurality of elements, selected from the group consisting of helium (He), neon (Ne), argon (Ar), krypton (Kr), and xenon (Xe) are used as the inert gas element. Among these elements, it is preferable to use argon (Ar) that is the low cost gas. A target of silicon is used under an atmosphere containing the rare gas element here to form the second semiconductor film. There are two meanings associated with including ions of rare gas element that is inert gas within the film; one is that dangling bonds are formed to impart distortions to the semiconductor film, and the other is that distortions are imparted within lattices of the semiconductor film. The latter can be obtained remarkably if an element with a greater atomic radius than that of silicon, such as argon (Ar), krypton (Kr), or xenon (Xe) is used. By including the rare gas element within the film, not only are lattice distortions formed unpaired bonds are also formed, to contribute to gettering action.

Heat treatment is performed next to perform gettering for reducing the concentration of the metallic element (nickel) in, or removing the metallic element from, the first semiconductor film (FIG. 3H). A treatment of irradiating strong light or thermal treatment may be performed as the heat treatment for the gettering. With the gettering, the metallic element moves in the direction of the arrow in FIG. 3H (that is, in the direction from the substrate side toward the surface of the second semiconductor film), to remove or lower the concentration of, the metallic element contained in the first semiconductor film 204b covered by the barrier layer 205b. The distance where the metallic element move during gettering may be a distance at least on the order of the thickness of the first semiconductor film, and gettering can be accomplished in a relatively short amount of time. Here, sufficient gettering is performed in order that all of the nickel is made to move to the second semiconductor film 206 without segregating in the first semiconductor film 204b. That is, gettering is performed in order that the nickel concentration within the first semiconductor film becomes equal to or less than $1 \times 10^{18}/cm^3$, preferably equal to or less than $1 \times 10^{17}/cm^3$.

It is also performed to repair damage caused by irradiating laser light (the first laser light and the second laser light) at the same time as gettering.

Next, after the second semiconductor film 206 is selectively removed with the barrier layer 205b as an etching stopper, the barrier layer 205b is also removed. The first semiconductor film 204b is then patterned using a known patterning technique to form a semiconductor layer with a predetermined shape.

Then, a TFT is completed in accordance with the subsequent processes that is the same as the processes of Embodiment Mode 1.

Further, it is possible to combine Embodiment Mode 2 with Embodiment Mode 1, or with other known gettering techniques.

In addition, irradiation of the second laser light may also be performed in an inert gas atmosphere or a vacuum to perform leveling after forming a semiconductor layer with a predetermined shape and then removing an oxide film, without performing the irradiation of the second laser light before gettering.

There will be an additionally detailed explanation regarding the aforementioned structures of the present invention with the embodiments shown below.

Embodiment 1

Embodiment 1 of the present invention will be described with reference to FIGS. 4 to 6. Here a detailed description is given on a method of simultaneously forming on the same substrate a TFT for a pixel portion and TFTs (an n-channel TFT and a p-channel TFT) for driver circuits that are provided in the periphery of the pixel portion.

First, in accordance with the above Embodiment Mode a base insulating film 301 is formed on a glass substrate 300, a first semiconductor film with crystalline structure is formed, and the semiconductor film is etched into desired shapes to form semiconductor layers 302 to 306 that are separated from one another like islands.

The detailed explanation on the process up through formation of the semiconductor layers 302 to 306, is shown Embodiment Mode. What follows is a simplified version thereof.

The base insulating film 301 provided on the glass substrate in Embodiment 1 has a two-layered structure. However, the base insulating film may be a single layer or three or more layers of insulating films. The first layer of the base insulating film 301 is a first silicon oxynitride film (composition ratio: Si=32%, O=27%, N=24%, H=17%) formed to have a thickness of 50 nm by plasma CVD with as reaction gas $SiH_4$, $NH_3$, and $N_2O$. The second layer of the base insulating film 1101 is a second silicon oxynitride film (composition ratio: Si=32%, O=59%, N=7%, H=2%) formed to have a thickness of 100 nm by plasma CVD with as reaction gas $SiH_4$ and $N_2O$.

Next, an amorphous silicon film is formed on the base insulating film 301 by plasma CVD to a thickness of 50. Then nickel acetate solution containing 10 ppm of nickel by weight is applied by a spinner to the semiconductor film. Instead of application, sputtering may be used to spray nickel element to the entire surface.

Next, heat treatment is performed to crystallize the amorphous semiconductor film to obtain the semiconductor film with crystalline structure. For this heat treatment, thermal treatment of the electric furnace or irradiation of strong light is used. In the case of using the thermal treatment of the electric furnace, the heat treatment is performed at 500 to 600° C. for 4 to 24 hours. The silicon film with a crystalline structure is obtained by performing the thermal treatment (550° C., four hours) for crystallization after the thermal treatment (500° C., one hour) for dehydration. In Embodiment 1, crystallization is performed by the thermal treatment using the furnace. However, crystallization can also be performed by the thermal treatment using the lamp anneal device.

Next, the semiconductor film is irradiated with the first laser light (XeCl: wavelength, 308 nm) in an atmosphere or an oxygen atmosphere to increase the crystallization ratio and repair defects remaining in the crystal grains. The laser light used is excimer laser light with a wavelength of 400 nm or less, or second harmonic or third harmonic of YAG laser. In either case, pulse laser light with a repetition frequency of about 10 to 1000 Hz is collected by an optical system into a beam of 100 to 500 $mJ/cm^2$, which irradiates the surface of the silicon film by scanning at an overlap ratio of 90 to 95%. Here, the first laser light is irradiated under conditions of a repetition frequency of 30 Hz and energy density 476 mJ/cm². The irradiation of the first laser light at this point is very important in order to remove or reduce a rare gas element (Ar, here) in the film. The oxide film formed by irradiating the first laser light and an oxide film formed by treating the surface with ozone water for 120 seconds together form a barrier layer that has a thickness of 1 to 5 nm in total.

On the barrier layer, an amorphous silicon film containing argon element as a gettering site is formed to have a thickness of 150 nm by sputtering. The conditions for forming the amorphous silicon film by sputtering in Embodiment 1 include setting the film formation pressure to 0.3 Pa, the gas (Ar) flow rate to 50 sccm, the film formation power to 3 kW, and the substrate temperature to 150° C. The amorphous silicon film formed under the above conditions contains argon element at an atomic concentration of $3 \times 10^{20}$ to $6 \times 10^{20}/cm^3$, and contains oxygen in an atomic concentration of $1 \times 10^{19}$ to $3 \times 10^{19}/cm^3$. Thereafter, a lamp annealing apparatus is used for thermal treatment at 650° C. for 3 minutes to perform gettering.

With the barrier layer as an etching stopper, the amorphous silicon film containing argon element, which is a gettering site, is selectively removed. The barrier layer is then selectively removed using diluted fluoric acid. It is desirable to remove the barrier layer that of oxide films after gettering since nickel tends to move into a region containing oxygen at a high concentration during gettering.

The second laser light is irradiated in a nitrogen atmosphere or vacuum atmosphere to smooth the surface of the semiconductor film. Excimer laser light with a wavelength equal to or less than 400 nm, or the second or the third harmonic of a YAG laser, is used for the laser light (the second laser light). In addition, light emitted from an ultraviolet light lamp may also be used as a substitute for the excimer laser light. Note that the energy density of the second laser light is made larger than the energy density of the first laser light, preferably from 30 to 60 mJ/cm² larger. Here, the second laser light is irradiated in an atmosphere with a repetition frequency of 30 Hz and energy density of 537 mJ/cm². The P-V value of the unevenness on the surface of the semiconductor film become equal to or less than 21 nm.

Although the second laser light is irradiated to the whole surface in Embodiment 1, at least a pixel portion may also be irradiated selectively since the reduction of off current is effective especially to TFTs of the pixel portion.

Next, a thin oxide film is formed by using ozone water on the surface of the obtained silicon film with a crystalline structure (also called a polysilicon film), and a resist mask is formed for etching to obtain the semiconductor layers with desired shapes, separated from one another like islands. After the semiconductor layers are obtained, the resist mask is removed.

In addition, in order to control the threshold (Vth) voltage of TFTs, the impurity element that gives the p-type or n-type conductivity may be doped to the semiconductor layers after forming the semiconductor layers. Impurity elements known to give semiconductor the p-type conductivity are Group 13 elements in the periodic table, such as boron (B), aluminum (Al), and gallium (Ga). Impurity elements known to give a semiconductor the n-type conductivity are Group 15 elements in the periodic table, such as phosphorus (P) and arsenic (As).

An etchant containing fluoric acid is used to remove the oxide film and wash the surface of the silicon film at the same time. Then, an insulating film mainly containing silicon as a gate insulating film 307 is formed. The gate insulating film in Embodiment 1 is a silicon oxynitride film (composition ratio: Si=32%, O=59%, N=7%, H=2%) formed by plasma CVD to have a thickness of 115 nm.

As shown in FIG. 4A, a first conductive film 308*a* with a thickness of 20 to 100 nm, a second conductive film 308*b* with a thickness of 100 to 400 nm, and a third conductive film 308*c* with a thickness of 20 to 100 nm are layered on the gate insulating film 307. In Embodiment 1, a 50 nm thick tungsten film, a 500 nm thick Al—Ti (alloy of aluminum and titanium) film, and a 30 nm thick titanium film are layered on the gate insulating film 307 in the order stated.

Conductive materials for forming the first to third conductive films are elements selected from the group consisting of Ta, W, Ti, Mo, Al, and Cu, or alloy or compound materials mainly containing the above element. Alternatively, as the first to third conductive films, a polycrystalline silicon film represented by a semiconductor film doped with an impurity element such as phosphorus. For instance, the first conductive film may be a tungsten nitride film instead of the tungsten film, the second conductive film may be a Al—Si (alloy of aluminum and silicon) film instead of the Al—Ti (alloy of aluminum and titanium) film, and the third conductive film may be a titanium nitride film instead of the titanium film. It is not always necessary to have three layers of conductive films, and two layers of conductive films, a tantalum nitride film and a tungsten film, for example, may be employed.

As shown in FIG. 4B, resist masks 310 to 315 are formed with light exposure to conduct the first etching treatment for forming gate electrodes and wiring lines. The first etching treatment is conducted under first and second etching conditions. ICP (inductively coupled plasma) etching is employed. The films can be etched into desired taper shapes by using ICP etching and adjusting etching conditions (the amount of electric power applied to a coiled electrode, the amount of electric power applied to a substrate side electrode, the temperature of the substrate side electrode, etc.) suitably. Examples of etching gas used include chlorine-based gas, typically, $Cl_2$, $BCl_3$, $SiCl_4$, or $CCl_4$, fluorine-based gas, typically, $CF_4$, $SF_6$, or $NF_3$, and $O_2$.

There is no limitation on selection of the etching gas, $BCl_3$, $Cl_2$, and $O_2$ are suitable here. The gas flow rate thereof is set to 65:10:5 (unit: sccm), and RF (13.56 MHz) electric power of 450 W is given to a coiled electrode at a pressure of 1.2 Pa to generate plasma for 117 second etching. The substrate side (sample stage) also receives RF (13.56 MHz) power of 300 W to apply substantially negative self-bias voltage. Under the first etching conditions, the Al film and the Ti film are etched and edge portions of the first conductive layer are tapered.

Switched to the second etching conditions, the etching gas is changed to $CF_4$, $Cl_2$, and $O_2$. The gas flow rate thereof is set to 25:25:10 (unit: sccm), and RF (13.56 MHz) power of 500 W is given to a coiled electrode at a pressure of 1 Pa to generate plasma for etching for about 30 seconds. The substrate side (sample stage) also receives RF (13.56 MHz) power of 20 W to apply substantially negative self-bias voltage. Under the second etching conditions with mixing $CF_4$ and $Cl_2$, the Al film, the Ti film, and the W film are etched to about the same degree. In order to perform etching without leaving any residue on the gate insulating film, the etching time is prolonged by approximately 10 to 20%.

In the first etching treatment, the edge portions of the first conductive layers, second conductive layers, and third conductive layers are tapered by forming the resist masks into proper shapes and by the effect of the bias voltage applied to the substrate. The angle of the tapered portions is 15 to 45°. First shape conductive layers 317 to 322 are thus formed from the first conductive layers, the second conductive layers, and the third conductive layers (the first conductive layers 317a to 322a, the second conductive layers 317b to 322b and the third conductive layers 317c to 322c) through the first etching treatment. Denoted by 316 is a gate insulating film and regions thereof that are not covered with the first shape conductive layers 317 to 322 are etched and thinned by about 20 to 50 nm.

Without removing the resist masks 310 to 315, second etching treatment is conducted next as shown in FIG. 4C. $BCl_3$ and $Cl_2$ are used as etching gas, the gas flow rate thereof is set to 20:60 (unit: sccm), and RF (13.56 MHz) power of 600 W is given to a coiled electrode at a pressure of 1.2 Pa to generate plasma for etching. The substrate side (sample stage) also receives RF (13.56 MHz) power of 100 W. Under these third etching conditions, the second conductive layers and the third conductive layers are etched. The aluminum film containing a minute amount of titanium and the titanium film are thus subjected to anisotropic etching under the third etching conditions to form second shape conductive layers 324 to 329 (the first conductive layers 324a to 329a, the second conductive layers 324b to 329b and the third conductive layers 324c to 329c). Denoted by 323 is a gate insulating film and regions thereof that are not covered with the second shape conductive layers 324 to 329 are etched and thinned slightly. The tapered portions of the first conductive layers have the same length in FIGS. 4B and 4C. However, the actual length varies among the tapered portions of the first conductive layers, depending on the wiring line width.

Without removing the resist masks, the first doping treatment is conducted to dope an impurity element that gives the n-type conductivity to the semiconductor layers. The doping treatment is performed with ion doping or ion implantation. In ion doping, the dose is set to $1.5 \times 10^{14}$ atoms/cm² and the acceleration voltage is set to 60 to 100 keV. Typically, phosphorus (P) or arsenic (As) is used as an impurity element that gives the n-type conductivity. In this case, the second shape conductive layers 324 to 328 serve as masks against the impurity element that gives the n-type conductivity and first impurity regions 330 to 334 are formed in a self-aligning manner. The first impurity regions 330 to 334 contain the impurity element that gives the n-type conductivity at a concentration of $1 \times 10^{16}$ to $1 \times 10^{17}/cm^3$.

Although the first doping treatment is conducted without removing the resist masks in Embodiment 1, the resist mask may be removed before the first doping treatment.

Figures 5A, 5B, 5C:
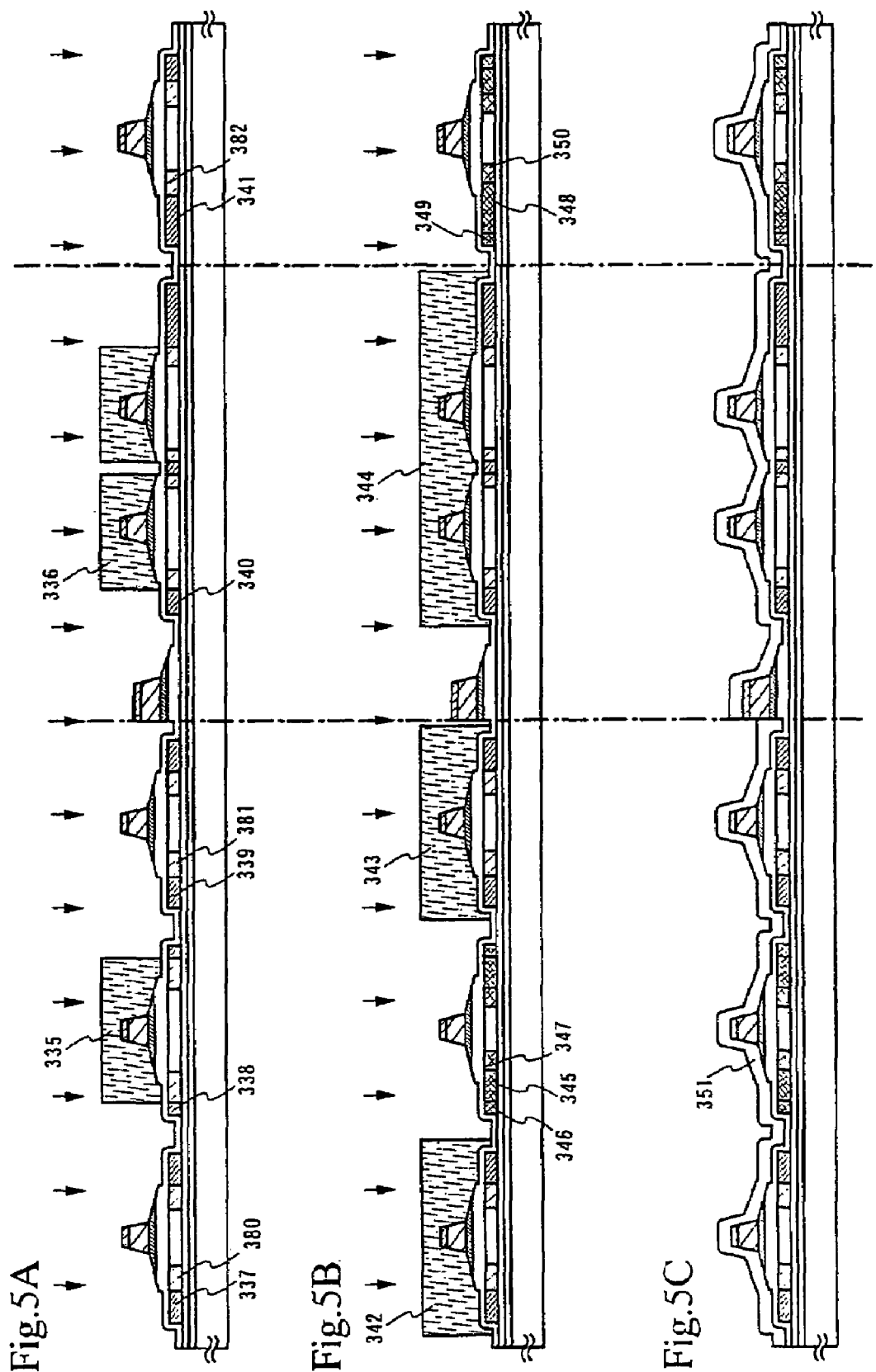
FIGS. 5A to 5C are diagrams showing the method of manufacturing an AM-LCD.

After the resist masks are removed, resist masks 335 and 336 are formed as shown in FIG. 5A for second doping treatment. The mask 335 functions for protecting a channel formation region and its surrounding regions in the semiconductor layer that forms one of p-channel TFTs of the driver circuit, and the mask 336 functions for protecting a channel formation region and its surrounding regions in the semiconductor layer that forms a TFT of the pixel portion. In FIG. 5A, the tapered portions of the first conductive layers have the same length for conveniences' sake. However, the actual length varies among the tapered portions of the first conductive layers, depending on the wiring line width. Accordingly, when a plurality of wiring lines which have different wiring line widths are formed on the same substrate, doped regions also have different widths.

The second doping treatment employs ion doping to dope the semiconductor layers with phosphorus (P) with the dose to $1.5 \times 10^{15}$ atoms/cm² and the acceleration voltage to 60 to 100 keV Here, impurity regions are formed in the semiconductor layers utilizing the difference in thickness of the second shape conductive layers 324 to 328 and the gate insulating film 323. The regions covered with the masks 335 and 336 are not doped with phosphorus (P). Second impurity regions 380 to 382 and third impurity regions 337 to 341 are thus formed. The third impurity regions 337 to 341 are doped with an impurity element that gives the n-type conductivity at a concentration of $1 \times 10^{20}$ to $1 \times 10^{21}/cm^3$. The second impurity regions are doped with the impurity element that gives the n-type conductivity at a lower concentration than in the third impurity regions due to the difference in thickness of the gate insulating film. The concentration of the impurity element in the second impurity regions is $1 \times 10^{18}$ to $1 \times 10^{19}/cm^3$.

After the resist masks 335 and 336 are removed, resist masks 342 to 344 are newly formed as shown in FIG. 5B for the third doping treatment. Through the third doping treatment, a fourth impurity region 347 and fifth impurity regions 345 and 346 are formed in the semiconductor layer for forming the p-channel TFT. The fourth and fifth impurity regions are doped with an impurity element that gives the p-type conductivity. The fourth impurity region is formed in a region that overlaps one of the second shape conductive layers and is doped with an impurity element that gives the p-type conductivity at a concentration of $1 \times 10^{18}$ to $1 \times 10^{20}/cm^3$. The fifth impurity regions 345 and 346 are doped with an impurity element that gives the p-type conductivity at a concentration of $1 \times 10^{20}$ to $1 \times 10^{21}/cm^3$. The fifth impurity region 346 is doped with phosphorus (P) in the previous step. However, through the third doping treatment, the region 346 is doped with an impurity element that gives the p-type conductivity at 1.5 to 3 times higher concentration than the concentration of phosphorus, and therefore has the p-type conductivity.

Fifth impurity regions 348 and 349 and a fourth impurity region 350 are formed in the semiconductor layer for forming a storage capacitor in the pixel portion.

Through the above steps, the impurity regions with the n-type or p-type conductivity are formed in the respective semiconductor layers. The second shape conductive layers 324 to 327 serve as gate electrodes. The second shape conductive layer 328 serves as one of electrodes constituting the storage capacitor in the pixel portion. The second shape conductive layer 329 forms a source wiring line in the pixel portion.

The order of etching and doping steps is not particularly limited to the order given above and may be changed as long as the conductive layers 324 to 327 and the impurity regions (the first to fifth impurity regions) are obtained.

Next, an insulating film (not shown in the drawing) is formed to cover the surface almost completely. The insulating film in Embodiment 1 is a silicon oxide film formed by plasma CVD to have a thickness of 50 nm. The insulating film is not limited to the silicon oxide film, and a single layer or a laminate layer of other insulating films that contains silicon may be used instead.

The next step is activation of the impurity elements doped in the semiconductor layers. The activation step is achieved by rapid thermal annealing (RTA) using a lamp light source, irradiation from the back side with YAG laser or excimer laser, or heat treatment using a furnace, or a combination of these methods. Since a material mainly containing aluminum is used for the second conductive layers in Embodiment 1, heating conditions in the activation step has to be set with taking into consideration the heat resistance of the second conductive layers.

During the activation treatment, the gettering, nickel used as a catalyst in crystallization is simultaneously moved to the third impurity regions 337, 339, and 340 and the fifth impurity regions 346 and 349 that contain high concentration of phosphorus. The concentration of nickel is reduced in the semiconductor layers for mainly forming channel formation regions. The TFTs which have the channel formation regions with the reduced nickel concentration have a lower OFF current value and provide high field effect mobility with a good crystallinity, and therefore excellent characteristics are achieved. In Embodiment 1, gettering has already been conducted once in accordance with the method shown in Embodiment Mode 1 in forming the semiconductor layers, gettering with phosphorus at this time is the second gettering. If the first gettering is performed sufficiently, the second time gettering is not particularly necessary.

Although the insulating film is formed before the activation in Embodiment 1, the insulating film may be formed after the activation.

Next, a silicon nitride film is formed as a first interlayer insulating film 351 and heat treatment (at 300 to 550° C. for 1 to 12 hours) is performed on the first interlayer insulating film to hydrogenate the semiconductor layers. (FIG. 5C) This step is performed for terminating dangling bonds in the semiconductor layers using hydrogen contained in the first interlayer insulating film 351. Irrespective of the presence or absence of the insulating film that is a silicon oxide film (not shown), the semiconductor layers can be hydrogenated. However, heating conditions in the hydrogenation step has to be set with taking into consideration the heat resistance of the second conductive layers since a material mainly containing aluminum is used for the second conductive layers in Embodiment 1. Other employable hydrogenation measures include plasma hydrogenation (which uses hydrogen excited by plasma).

On the first interlayer insulating film 351, a second interlayer insulating film 352 is formed from an organic insulating material. In Embodiment 2, an acrylic resin film with a thickness of 1.6 μm is used. A contact hole reaching the source wiring line 327 and contact holes reaching respective impurity regions are formed next. In Embodiment 1, a plurality of etching processes are sequentially conducted. The contact holes are formed by etching the second interlayer insulating film with the first interlayer insulating film as an etching stopper, then etching the first interlayer insulating film with the insulating film (not shown) as an etching stopper, and then etching the insulating film (not shown).

Thereafter, wiring lines and a pixel electrode are formed using Al, Ti, Mo, W, or the like. It is desirable materials for the electrodes and pixel electrode are highly reflective materials such as a film mainly containing Al or Ag, or a laminate of a film mainly containing Al and a film mainly containing Ag. Thus formed are source or drain wiring lines 353 to 358, a gate wiring line 360, a connection wiring line 359, and a pixel electrode 361.

A driver circuit 406 that has an n-channel TFT 401, a p-channel TFT 402, and an n-channel TFT 403, and a pixel portion 407 that has an n-channel TFT 404 and a storage capacitor 405 are formed on the same substrate by the method described above. (FIG. 6) Such a substrate is called in this specification as an active matrix substrate for conveniences' sake.

Figure 22:
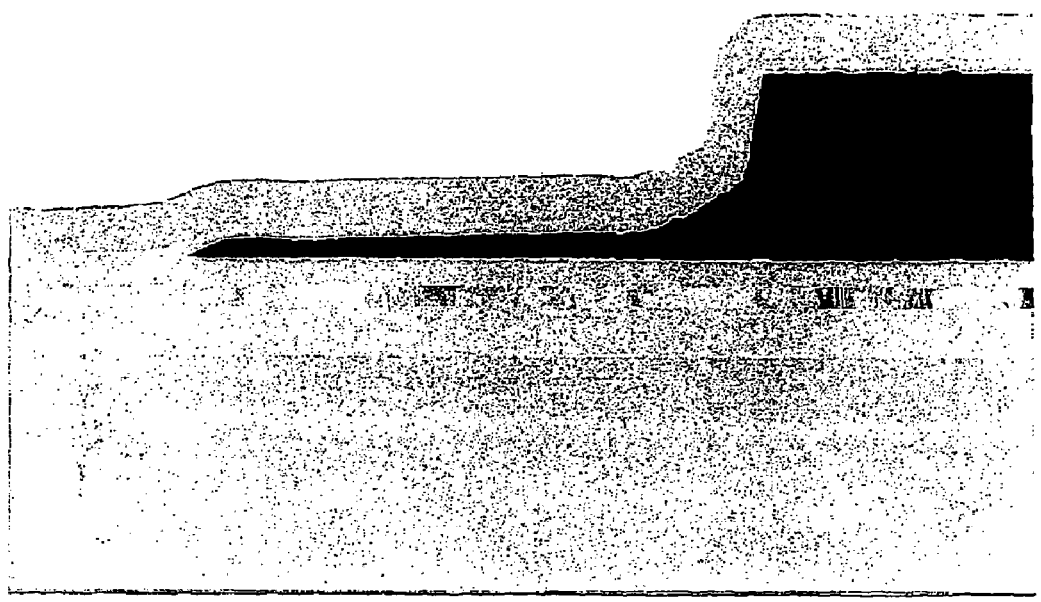
FIG. 22 is a TEM photograph showing the vicinity of a gate electrode (Embodiment 1)
Figure 23:
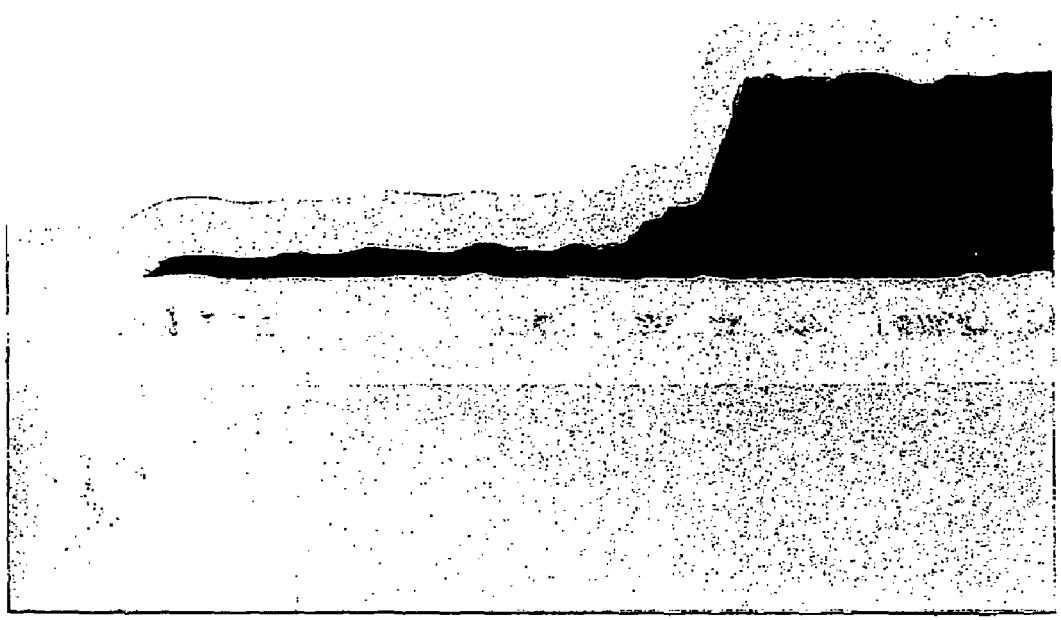
FIG. 23 is a TEM photograph showing the vicinity of a gate electrode (Comparative Sample).

Further, TEM observation photograph of a sectional view of the gate electrode neighborhood at this stage is shown in FIG. 22. As shown in FIG. 22, the surface of the semiconductor film (including the surface of LDD region) is smooth by the second laser light. The influence of unevenness at the surface of LDD region is hardly seen for the taper portion of the gate electrode and the gate insulating film on the LDD region since LDD region become smooth. As a comparable example, TEM observation photograph of a sectional view of the gate electrode neighborhood without performing leveling treatment is shown in FIG. 23.

The n-channel TFT 401 (first n-channel TFT) of the driver circuit 406 has a channel formation region 362, a second impurity region 363 partially overlapping the second shape conductive layer 324 that serves as a gate electrode, and a third impurity region 364 that functions as a source region or a drain region. The p-channel TFT 402 has a channel formation region 365, a fourth impurity region 366 partially overlapping the second shape conductive layer 325 that serves as a gate electrode, and a fifth impurity region 367 that functions as a source region or a drain region. The n-channel TFT 403 (second n-channel TFT) has a channel formation region 368, a second impurity region 369 partially overlapping the second shape conductive layer 326 that serves as a gate electrode, and a third impurity region 370 that functions as a source region or a drain region. The n-channel TFTs and the p-channel TFT can be used to form a shift register circuit, a buffer circuit, a level shifter circuit, a latch circuit, and the like. The structure of the n-channel TFT 401 or 403 is suitable especially for a buffer circuit that needs high driving voltage for preventing degradation by hot carrier effect.

The pixel TFT 404 (first n-channel TFT) of the pixel portion 407 has a channel formation region 371, a first impurity region 372 formed outside of the second shape conductive layer 328 that serves as a gate electrode, and a third impurity region 373 that functions as a source region or a drain region. A fourth impurity region 376 and a fifth impurity region 377 are formed in the semiconductor layer that functions as one of the electrodes of the storage capacitor 405. The storage capacitor 405 is composed of the second shape electrode 329 and the semiconductor layer 306 with an insulating film (the same film as the gate insulating film) as dielectric.

In the pixel TFT of the pixel portion 407, OFF current and dispersion are decreased remarkably by irradiating of the second laser light in comparison with the conventional one.

If the pixel electrode is formed of a transparent conductive film with one more photo mask, a transmissive display device is obtained.

Embodiment 2

The gate electrodes have a three-layered structure in the example shown in Embodiment 1. In Embodiment 2, gate electrodes have a two-layered structure. Embodiment 2 is identical with Embodiment 1 except the gate electrodes. Accordingly, only the difference is described.

In Embodiment 2, a TaN film with a thickness of 30 nm is formed as a first conductive film and a W film with a thickness of 370 nm is layered thereon as a second conductive film. The TaN film is formed by sputtering with a Ta target in an atmosphere containing nitrogen, and the W films are formed by sputtering with a W target. An alloy film of W and Mo can be substituted for W film.

As in Embodiment 1, Embodiment 2 employs ICP etching to etch the films into desired taper shapes by adjusting etching conditions (the amount of electric power applied to a coiled electrode, the amount of electric power applied to a electrode of a substrate side, the temperature of the electrode the substrate side, etc.) suitably. The examples of etching gas used include chlorine-based gas represented by $Cl_2$, $BCl_3$, $SiCl_4$, or $CCl_4$, fluorine-based gas, $CF_4$, $SF_6$, or $NF_3$, and $O_2$.

Similar to Embodiment 1, the first etching treatment in Embodiment 2 uses first and second etching conditions. The first etching conditions include using as etching gas $CF_4$, $Cl_2$, and $O_2$, setting the gas flow rate thereof to 25:25:10 (unit: sccm), and giving an RF (13.56 MHz) power of 500 W to a coiled electrode at a pressure of 1 Pa to generate plasma. The substrate side (sample stage) also receives an RF (13.56 MHz) power of 150 W to apply substantially negative self-bias voltage. Under the first etching conditions, the etching rate to the W film is 200.39 nm/min. and the etching rate to the TaN film is 80.32 nm/min. The selective ratio of W to TaN is therefore about 2.5. The W film is tapered under the first etching conditions at an angle of about 26°.

Thereafter the first etching conditions are switched to the second etching conditions without removing the resist masks. The etching gas is changed to $CF_4$ and $Cl_2$, the gas flow rate thereof is set to 30:30 (unit: sccm), and an RF (13.56 MHz) power of 500 W is given to a coiled electrode at a pressure of 1 Pa to generate plasma, to perform etching for about 30 seconds. The substrate side (sample stage) also receives an RF (13.56 MHz) power of 20 W to apply substantially negative self-bias voltage. Under the second etching conditions including the use of a mixture of $CF_4$ and $Cl_2$, the TaN film and the W film are etched to about the same degree. The etching rate to the W film is 58.97 nm/min. and the etching rate to the TaN film is 66.43 nm/min. under the second etching conditions.

In the first etching treatment, first conductive layers and second conductive layers are tapered around the edges by forming the resist masks into proper shapes and by the effect of the bias voltage applied to the substrate side. The angle of the tapered portions may be 15 to 45°.

The second etching treatment is conducted as in Embodiment 1. Here, the etching gas is $SF_6$, $Cl_2$, and $O_2$, the gas flow rate thereof is set to 24:12:24 (unit: sccm), and an RF (13.56 MHz) power of 700 W is given to a coiled electrode at a pressure of 1.3 Pa to generate plasma, in order to perform etching for 25 seconds. The substrate side (sample stage) also receives an RF (13.56 MHz) power of 10 W to apply substantially negative self-bias voltage. In the second etching treatment, the etching rate to the W film is 227.3 nm/min. and the etching rate to the TaN film is 32.1 nm/min. The selective ratio of W to TaN is therefore 7.1. The etching rate to the silicon oxynitride film (SiON) that serves as the gate insulating film is 33.7 nm/min. The selective ratio of W to TaN is 6.83. The W film is tapered in the second etching treatment at an angle of 70°.

Compared to Embodiment 1, the electric resistance of the gate electrodes in Embodiment 2 are higher because of being formed from a laminate of a W film and a TaN film. However, the gate electrodes in Embodiment 2 have higher heat resistance, and have advantageously no influence by activation or hydrogenation conditions.

Embodiment 3

Embodiment 3 describes a process of manufacturing an active matrix liquid crystal display device from the active matrix substrate fabricated in Embodiment 1. The description is given with reference to FIG. 7.

Figure 6:
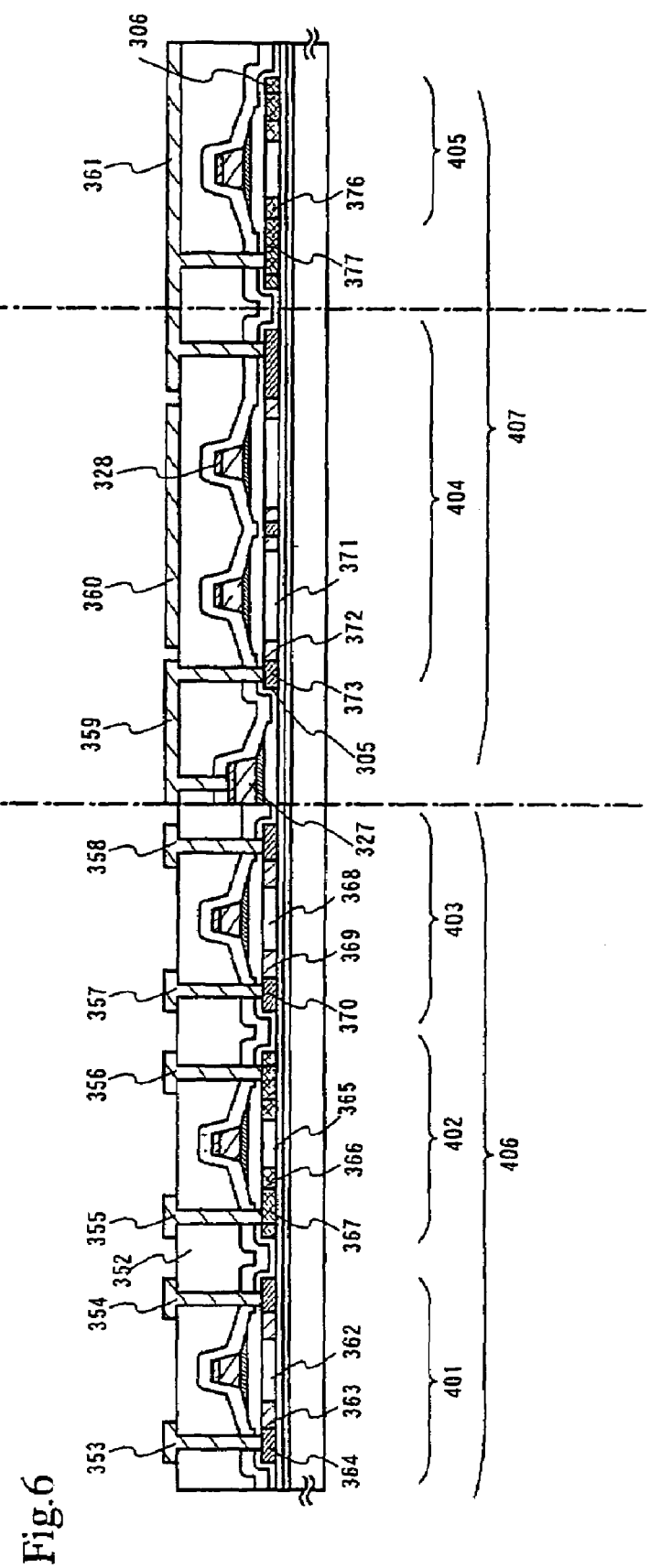
FIG. 6 is a cross sectional structure diagram of an active matrix substrate.

After the active matrix substrate as illustrated in FIG. 6 is obtained in accordance with Embodiment 1, an orientation film is formed on the active matrix substrate of FIG. 6 and subjected to rubbing treatment. In this embodiment, before the orientation film is formed, an organic resin film such as an acrylic resin film is patterned to form columnar spacers for keeping an interval between substrates in desired positions. The columnar spacers may be replaced by spherical spacers sprayed onto the entire surface of the substrate.

An opposite substrate is prepared next. The opposite substrate has a color filter in which colored layers and light-shielding layers are arranged with respect to the pixels. A light-shielding layer is also placed in the driver circuit portion. A leveling film is formed to cover the color filter and the light-shielding layer. On the leveling film, an opposite electrode of a transparent conductive film is formed in the pixel portion. An orientation film is formed over the entire surface of the opposite substrate and is subjected to rubbing treatment.

Then the opposite substrate is bonded to the active matrix substrate on which the pixel portion and the driver circuits are formed, with a sealing member (not shown). The sealing member has a filler mixed therein, and the two substrates are bonded with an uniform interval by the filler together with the columnar spacers. Thereafter a liquid crystal material is injected between the substrates and an encapsulant (not shown) is used to completely seal the substrates. A known liquid crystal material can be used. The active matrix liquid crystal display device is thus completed. If necessary, the active matrix substrate or the opposite substrate is cut into pieces with desired shapes. The display device may be appropriately provided with a polarizing plate using a known technique. Then FPCs are attached using a known technique.

Figure 7:
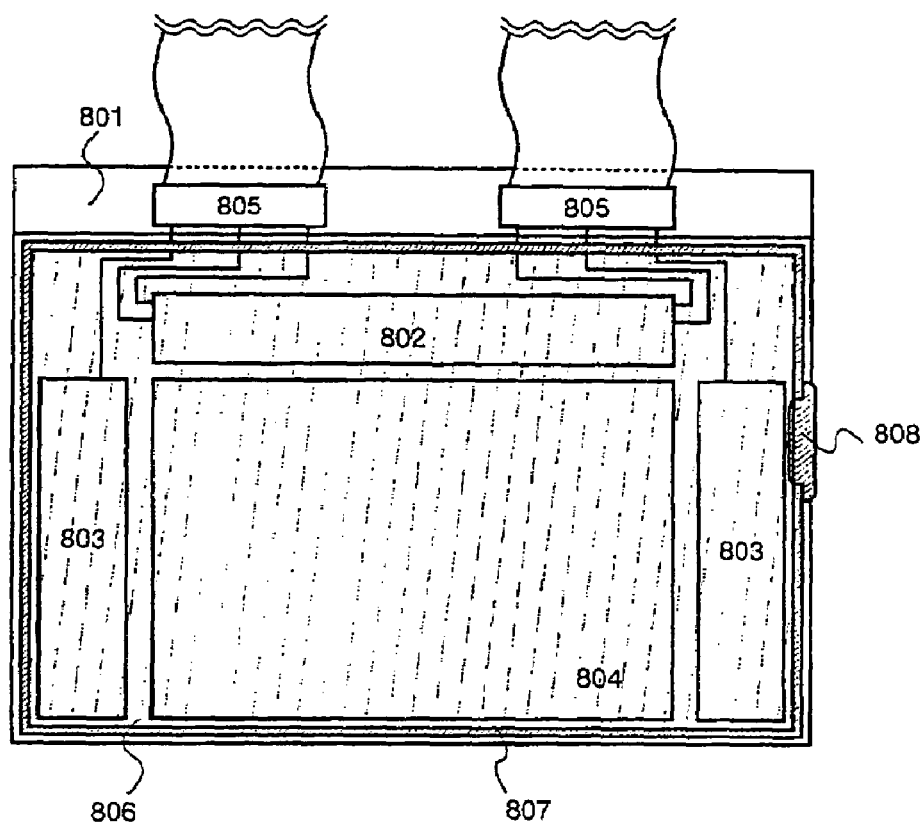
FIG. 7 is an upper surface diagram showing an external view of a liquid crystal module.

The structure of the thus obtained liquid crystal module is described with reference to the top view in FIG. 7.

A pixel portion 504 is placed in the center of an active matrix substrate 501. A source signal line driver circuit 502 for driving source signal lines is positioned above the pixel portion 504. Gate signal line driver circuits 503 for driving gate signal lines are placed in the left and right of the pixel portion 504. Although the gate signal line driver circuits 503 are symmetrical with respect to the pixel portion in Embodiment 3, the liquid crystal module may have only one gate signal line driver circuit on one side of the pixel portion. A designer can choose the arrangement that suits better considering the substrate size or the like of the liquid crystal module. However, the symmetrical arrangement of the gate signal line driver circuits shown in FIG. 7 is preferred in terms such as operation reliability and driving efficiency of the circuit.

Signals are inputted to the driver circuits from flexible printed circuits (FPC) 505. The FPCs 505 are press-fit through an anisotropic conductive film or the like after opening contact holes in the interlayer insulating film and resin film and forming a connection electrode 602 so as to reach the wiring lines arranged in given places of the substrate 501. The connection electrode is formed of ITO in this embodiment.

A sealing agent 507 is applied along a perimeter of the substrate in the periphery of the driver circuits and the pixel portion. Then, an opposite substrate 506 is bonded to the substrate 501 while a spacer formed in advance on the active matrix substrate keeps the gap between the two substrates constant. A liquid crystal element is injected through a portion that is not coated with the sealing agent 507. The substrates are then sealed by an encapsulant 508. The liquid crystal module is completed through the above steps.

Although all of the driver circuits are formed on the substrate here, several ICs may be used for some of the driver circuits.

Embodiment 4

Embodiment 1 shows an example of reflective display device in which a pixel electrode is formed of a reflective metal material. Shown in Embodiment 4 is an example of transmissive display device in which a pixel electrode is formed of a light-transmitting conductive film.

The manufacturing process up to forming an interlayer insulating film is identical with the process of Embodiment 1, and the description thereof is omitted here. After the interlayer insulating film is formed in accordance with Embodiment 1, a pixel electrode 601 is formed of a light-transmitting conductive film. Examples of the light-transmitting conductive film include an ITO (indium tin oxide alloy) film, an indium oxide-zinc oxide alloy ($In_2O_3$—ZnO) film, a zinc oxide (ZnO) film, and the like.

Thereafter, contact holes are formed in an interlayer insulating film 600. A connection electrode 602 overlapping the pixel electrode is formed next. The connection electrode 602 is connected to a drain region through the contact hole. At the same time, source electrodes or drain electrodes of other TFTs are formed.

Although all of the driver circuits are formed on the substrate here, several ICs may be used for some of the driver circuits.

Figure 8:
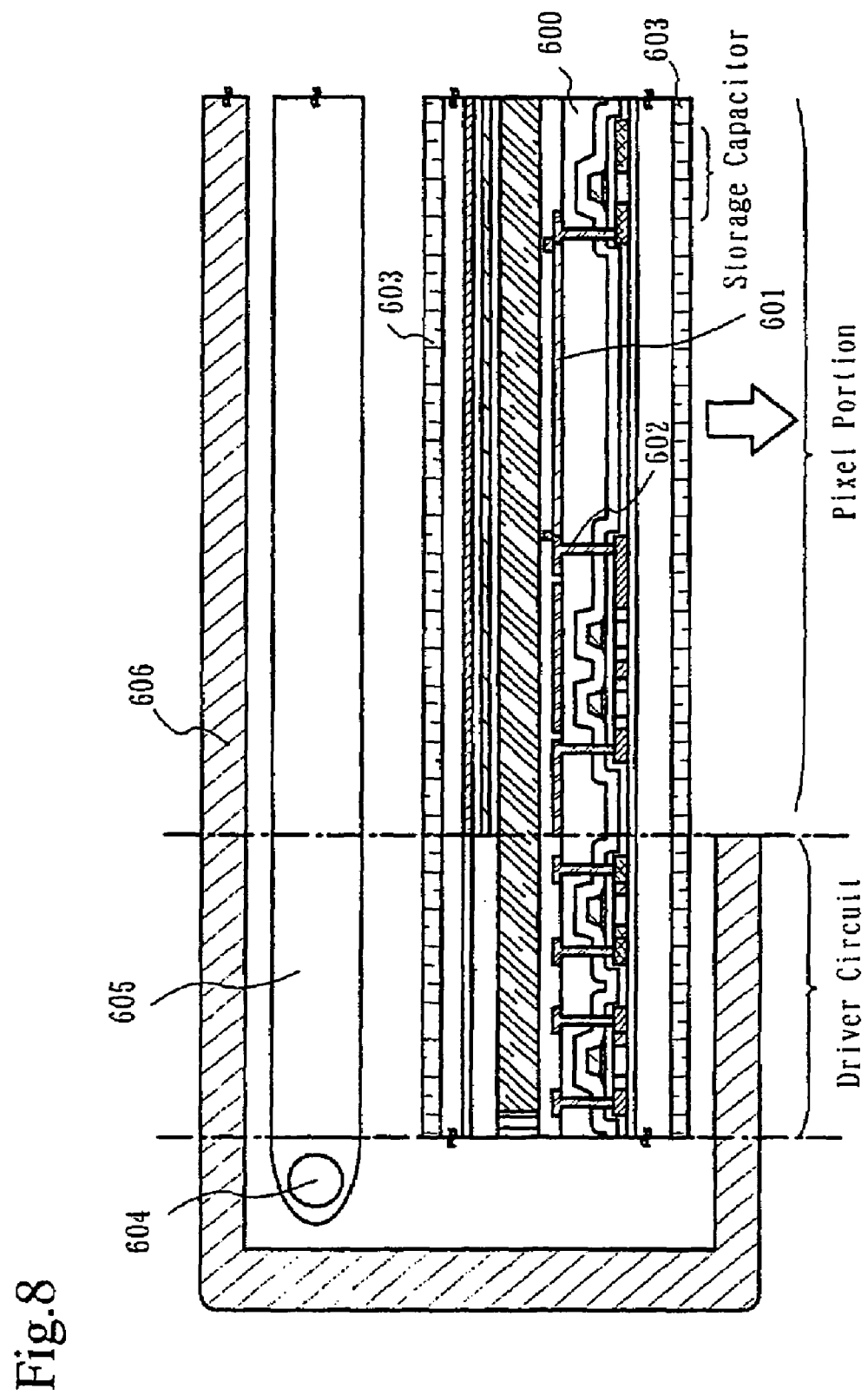
FIG. 8 is a diagram showing an example of a cross sectional diagram of a liquid crystal display device.

An active matrix substrate is thus completed. A liquid crystal module is manufactured from this active matrix substrate in accordance with Embodiment 3. The liquid crystal module is provided with a backlight 604 and a light guiding plate 605, and is covered with a cover 606 to complete an active matrix liquid crystal display device a partial sectional view of the an active matrix liquid crystal display device is shown in FIG. 8. The cover is bonded to the liquid crystal module using an adhesive or an organic resin. In bonding the substrate to the opposite substrate, the substrates may be surrounded by a frame in order that the space between the frame and the substrates is filled with an organic resin for bonding. Since the display device is of transmissive type, each of the active matrix substrate and the opposite substrate needs to have a polarizing plate 603 bonded.

Embodiment 5

In Embodiment 5, an example of forming the light-emitting display device equipped with EL (electro luminescence) element is shown in FIG. 9. The OLED includes a layer (hereinafter, referred to as organic light emitting layer) containing an organic compound (organic light emitting material) in which luminescence generated by application of an electric field (electro-luminescence) is obtained, an anode and a cathode. For the light-emitting device using the OLED, a TFT is an indispensable element for the active matrix driving. In the light-emitting device using the OLED, the TFT which functions as a switching element, and the TFT for supplying current to the OLED, are at least provided each pixel. For example, in the case of overall white display, dispersion is exists in the brightness when ON current flows inconstantly. The reason for the above is that ON current (Ion) of the TFT, which is electrically connected to the OLED and supplies current to OLED, determines the brightness of the pixel, which does not depend on the pixel structure and the driving method. These problems can be solved by the present invention.

Figure 9A:
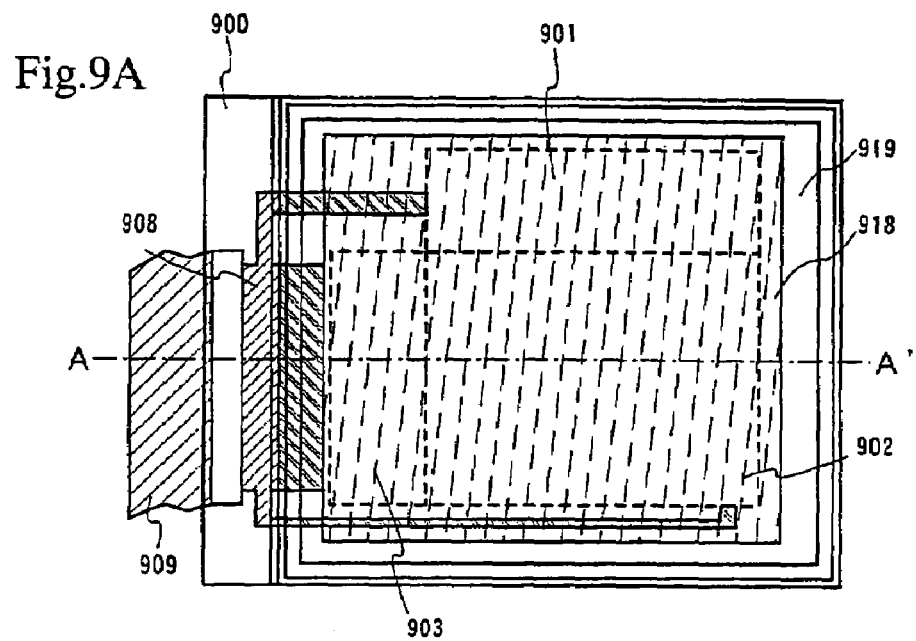
FIGS. 9A and 9B are diagrams showing an upper surface and a cross section, respectively, of an EL module.
Figure 9B:
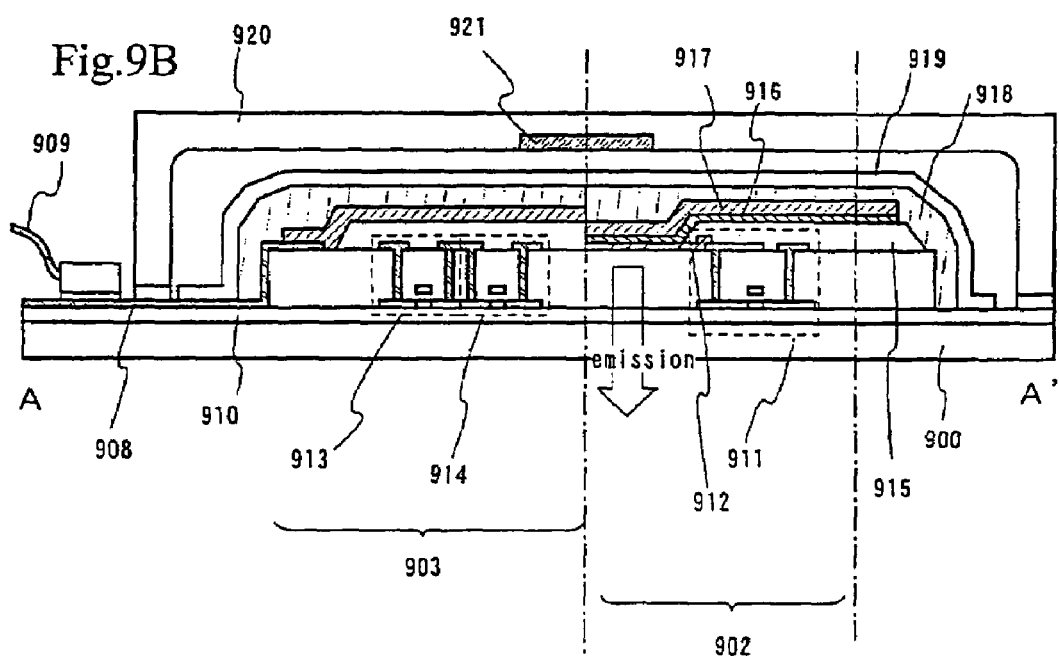

FIG. 9A is a top view of an EL module and FIG. 9B is a sectional view taken along the line A–A' of FIG. 9A. A pixel portion 902, a source side driver circuit 901, and a gate side driver circuit 903 are formed on a substrate 900 (for example, a glass substrate, a crystallized glass substrate, or a plastic substrate) having an insulating surface. The pixel portion and the driver circuits are obtained in accordance with the above Embodiments. Denoted by 918 and 919 are a sealing member and a DLC film that serves as a protective film, respectively, and the pixel portion and the driver circuits are covered with the sealing member 918 which is covered with the protective film 919. Further, the module is sealed by a cover member 920 using an adhesive. Desirably, the same material is used for the cover member 920 and the substrate 900 in order to avoid deformation by heat or external force. For example, a glass substrate is used for the cover member and processed by sand blasting or the like to have a concave shape (3 to 10 $\mu$m in depth) shown in FIG. 9. It is desirable to further process the cover member to form a concave portion (50 to 200 $\mu$m in depth) for housing a drying agent 921. If the EL module is manufactured with being multifaceted, a $CO_2$ laser or the like is used for cutting to make ends even after bonding the cover member to the substrate.

There is a wiring line 908 for transmitting input signals to the source side driver circuit 901 and the gate side driver circuit 903. The wiring line 908 receives video signals and clock signals from an FPC (flexible printed circuit) 909 that serves as an external input terminal. Although the FPC alone is shown here, a printed wiring board (PWB) may be attached to the FPC. The term light-emitting device in this specification refers to not only a light-emitting device itself but also a state equipped with an FPC or a PWB.

The sectional structure of the light emitting display device is described next with reference to FIG. 9B. An insulating film 910 is formed on the substrate 900. On the insulating film 910, the pixel portion 902 and the gate side driver circuits 903 are formed. The pixel portion 902 is composed of a plurality of pixels each including a current controlling TFT 911 and a pixel electrode 912 electrically connected to a drain of the current controlling TFT 911. The gate side driver circuit 903 is formed from a CMOS circuit that has a combination of an n-channel TFT 913 and a p-channel TFT 914.

These TFTs (including 911, 913, and 914) can be manufactured in accordance with the above Embodiments. In the semiconductor device which has the OLED, dispersion of on current (Ion) of the TFT (the TFT for supplying current to the driver circuit or the OLED provided in the pixel), arranged in order that constant current flows to the pixel electrode, can be lowered, and dispersion of the brightness can also be lowered.

The pixel electrode 912 functions as an anode of a light-emitting element (EL element). Banks 915 are formed on both sides of the pixel electrode 912. An EL layer 916 is formed on the pixel electrode 912 and a cathode 917 of the light-emitting element is formed thereon.

The EL layer 916, for light emission and for moving carriers to emit light, may have freely a combination of electric charge transporting layers or electric charge injection layers with a light-emitting layer. It is possible, for example, to use a low molecular weight organic EL material, or a high molecular weight organic EL material for the EL layer 916. The EL layer may has a thin film of a light emitting material (singlet compound) that emits light (fluorescence) by singlet excitation or a thin film of a light emitting material (triplet compound) that emits light (phosphorescence) by triplet excitation. The electric charge transporting layers and electric charge injection layers may be formed of inorganic materials such as silicon carbide. Known organic materials and inorganic materials can be used.

The cathode 917 also functions as a common wiring line to all the pixels, and is electrically connected to the FPC 909 through the connection wiring line 908. The elements included in the pixel portion 902 and in the gate side driver circuit 903 are all covered with the cathode 917, the sealing member 918, and the protective film 919.

A material which is transparent or translucent to visible light is preferably used for the sealing member 918, which is also preferred to allow as little moisture and oxygen as possible to transmit.

After the light emitting element is completely covered with the sealing member 918, the protective film 919 of a DLC film is at least formed on the surface (exposed surface) of the sealing member 918 as shown in FIG. 9B. In addition, the protective film may be formed on the entire surface including a back side of the substrate. At this point, attention must be paid so as not to form the protective film in the area where the external input terminal (FPC) is to be provided. A mask may be employed to form the protective film on the surface except for the area for the external input terminal. Alternatively, a tape, which is used in a CVD apparatus as a masking tape may be used to cover the external input terminal area and avoid forming the protective film on the area.

With the above structure, the light-emitting element is sealed by the sealing member 918 and the protective film to completely shut the light-emitting element off from the outside, and moisture, oxygen, and other external substances, that accelerate degradation of the EL layer due to an oxidation, are thus prevented from entering. Therefore a highly reliable light-emitting device can be obtained.

Figure 10:
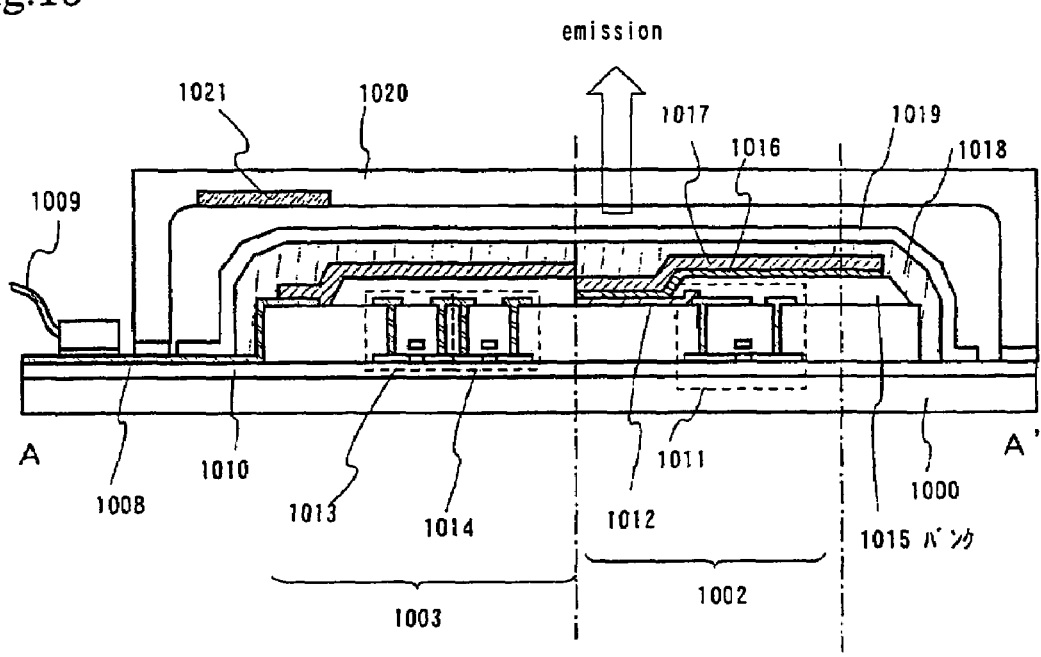
FIG. 10 is a diagram showing a cross section of an EL module.

The cathode may serve as the pixel electrode and the EL layer and the anode may be layered on the cathode, and in the case, the light-emitting device emits light in the reverse direction to the direction shown in FIG. 9B. FIG. 10 shows an example of this light-emitting device. A top view thereof is identical with FIG. 9A and therefore is omitted.

The sectional structure shown in FIG. 10 is described below. A substrate 1000 may be a glass substrate or a quartz substrate, and semiconductor substrate or a metal substrate may also be used. An insulating film 1010 is formed on the substrate 1000, and a pixel portion 1002 and a gate side driver circuit 1003 are formed on the insulating film 1010. The pixel portion 1002 is composed of a plurality of pixels each including a current controlling TFT 1011 and a pixel electrode 1012 electrically connected to a drain of the current controlling TFT 1011. The gate side driver circuit 1003 is formed from a CMOS circuit that has a combination of an n-channel TFT 1013 and a p-channel TFT 1014.

The pixel electrode 1012 functions as a cathode of the light-emitting element. Banks 1015 are formed on both sides of the pixel electrode 1012. An EL layer 1016 is formed on the pixel electrode 1012 and an anode 1017 of the light-emitting element is formed thereon.

The anode 1017 also functions as a common wiring line to all the pixels, and is electrically connected to an FPC 1009 through a connection wiring line 1008. The elements included in the pixel portion 1002 and in the gate side driver circuit 1003 are all covered with the anode 1017, a sealing member 1018, and a protective film 1019 that is formed of DLC or the like. A cover member 1020 is bonded to the substrate 1000 with an adhesive. The cover member has a concave portion for housing a drying agent 1021.

A material which is transparent or translucent to visible light is preferably used for the sealing member 1018, which is also preferred to allow as little moisture and oxygen as possible to transmit.

In FIG. 10, the pixel electrode serves as the cathode and the EL layer and the anode are layered thereon. Therefore, light is emitted in the direction indicated by the arrow in FIG. 10.

Embodiment 5 may be combined with Embodiment 1 or Embodiment Modes 1 or 2.

Embodiment 6

Figure 11:
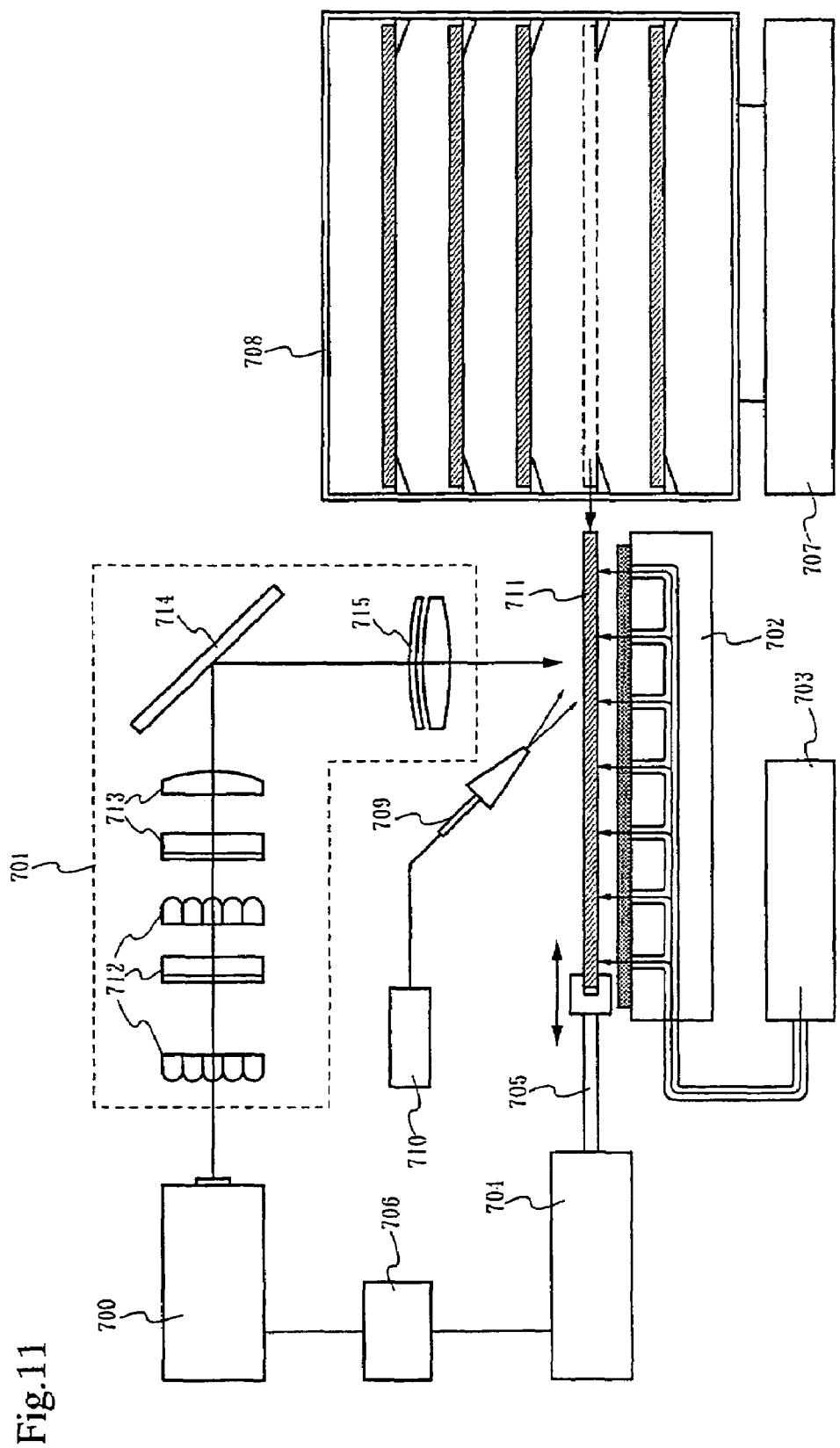
FIG. 11 is a diagram showing a state of a laser processing apparatus.
Figure 12:
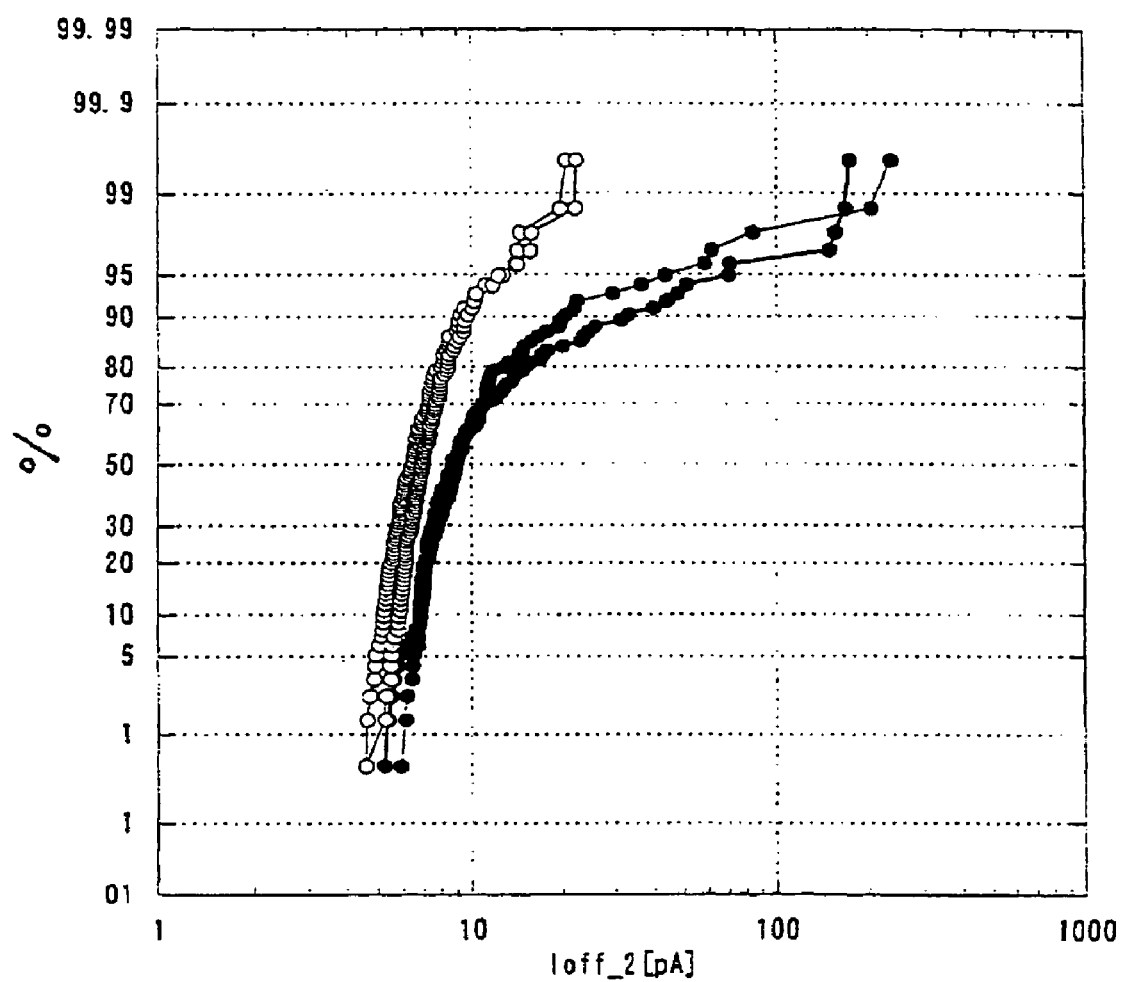
FIG. 12 is a statistical data distribution diagram for off current values (with Vds=14 V)

FIG. 11 is a diagram showing an example of a laser processing apparatus which is capable of being applied to the present invention. This apparatus is constituted of a laser 700, an optical system 701, a substrate stage 702, a substrate conveyor means 704, a blower 710, and the like. Further, a cassette 708 for holding a substrate 711, a cassette holder 707, a nozzle 709 that becomes a gas exhaust port in removing debris and the like on the substrate by a gas supplied from a blower, and the like are prepared as accessories. Note that gas emitted from the nozzle 709 is blown to regions in which laser light is irradiated.

A gaseous state laser such as an excimer laser that emits light with a wavelength equal to or less than 400 nm, or a solid state laser such as Nd-YAG laser, Nd-YVO$_4$ laser, or a YLF laser is used as the laser. In addition to the fundamental harmonic (1060 nm), harmonic such as the second harmonic (532 nm) or the third harmonic (353.3 nm) can be used with the Nd-YAG laser. The laser which performs pulse emission with an emission frequency on the order of 5 to 300 Hz is employed.

The optical system 701 is a system for condensing and expanding laser light emitted from the laser 700, and irradiating linear laser light with a fine line cross section to a surface to be irradiated. Although the structure of the optical system 701 may be arbitrary, it is structured here by using components such as a cylindrical lens array 712, a cylindrical lens 713, a mirror 714, and a doublet cylindrical lens 715. It is possible to irradiate linear shape laser light which has a length in the longitudinal direction on the order of 100 to 400 mm and a length in the width direction on the order of 100 to 500 µm although it depends upon the size of the lenses.

The stage 702 maintains the substrate 711 to be processed, and moves in synchronization with the laser. A gas supply means 703 for supplying compressed air or compressed nitrogen is connected to the stage 702. Gas is blown from pores provided in a main surface of the stage 702 to make it possible to hold the substrate 711 without contact with the stage 702. The substrate can be held without bowing by maintaining a state in which the gas blown out from the pores strikes a main surface of the substrate. The height at which the substrate 711 floats can be set at 10 µm to 1 cm. Contamination of the substrate 711 can be prevented and changes in the temperature of the substrate can be made smaller, by holding the substrate 711 without direct contact with the stage.

It is performed by the conveyor means 704 to take the substrate 711 out from the cassette 708 and move thereof accompanied with laser processing. An arm 705 is prepared in the conveyor means 704. It becomes possible to irradiate the linear laser light over the entire substrate with the arm 705 grasping one end of the substrate 711 and moving in an axial direction. The conveyor means 704 is operated in accordance with a control device 706, with being linked with emission of the laser 700.

Further, a conveyor means which is capable of moving the substrate in a normal direction to the axial direction is prepared in the case in which a side of the substrate 711 has a larger length than the length of the linear laser light in the longitudinal direction (not shown in the figure). It becomes possible to irradiate the laser light over the entire substrate surface by using the two conveyor means which are capable of moving the substrate in mutually perpendicular directions.

This type of laser apparatus is particularly effective in the case of processing glass substrate with a length of an edge over 1000 mm and a thickness equal to or less than 1 mm. For example, a glass substrate which has a size of 1200 mm×1600 mm or 2000 mm×2500 mm and has a thickness of 0.4 to 0.7 mm can be processed. A glass substrate easily bow if the surface area of the glass substrate is large-sized and the thickness becomes small. However, the substrate can be held with maintaining a level surface by holding the substrate using the gas blown out from the pores in the stage 702, as explained above.

Further, it is possible to freely combine Embodiment 6 with any one of Embodiment Mode 1, Embodiment Mode 2, and Embodiments 1 to 5. For example, it is possible to apply Embodiment 6 to the irradiation of the first laser light in Embodiment Mode 1. At this time, air, or a gas containing oxygen, blown out from the nozzle may be blown out to regions to which the laser light is irradiated. Furthermore, it is possible to apply Embodiment 6 to the irradiation of the second laser light in Embodiment Mode 1. In this case, an inert gas, for example, nitrogen, is used as the gas emitted from the nozzle, and may be blown out to the regions at which the laser light is irradiated to perform leveling the surface of the semiconductor film. It is therefore not necessary to replace the atmosphere within a processing chamber for irradiating laser light in the case of combining Embodiment 6 with Embodiment Mode 1. It can be performed to irradiating the first laser light and the second laser light in a short amount of time by appropriately switching the gas blown out from the nozzle.

Embodiment 7

The driver circuit portion and the pixel portion fabricated by implementing the present invention can be utilized for various modules (active matrix liquid crystal module, active matrix EL module and active matrix EC module). Namely, all of the electronic apparatuses are completed by implementing the present invention.

Following can be given as such electronic apparatuses: video cameras; digital cameras; head mounted displays (goggle type displays); car navigation systems; projectors; car stereo; personal computers; portable information terminals (mobile computers, mobile phones or electronic books etc.) etc. Examples of these are shown in FIGS. 14A–14F, 15A–15D and 16A–16C.

FIG. 14A is a personal computer which comprises: a main body 2001; an image input section 2002; a display section 2003; and a keyboard 2004.

FIG. 14B is a video camera which comprises: a main body 2101; a display section 2102; a voice input section 2103; operation switches 2104; a battery 2105 and an image receiving section 2106.

FIG. 14C is a mobile computer which comprises: a main body 2201; a camera section 2202; an image receiving section 2203; operation switches 2204 and a display section 2205.

FIG. 14D is a goggle type display which comprises: a main body 2301; a display section 2302; and an arm section 2303.

FIG. 14E is a player using a recording medium which records a program (hereinafter referred to as a recording medium) which comprises: a main body 2401; a display section 2402; a speaker section 2403; a recording medium 2404; and operation switches 2405. This apparatus uses DVD (digital versatile disc), CD, etc. for the recording medium, and can perform music appreciation, film appreciation, games and use for Internet.

FIG. 14F is a digital camera which comprises: a main body 2501; a display section 2502; a view finder 2503; operation switches 2504; and an image receiving section (not shown in the figure).

Figure 15A:
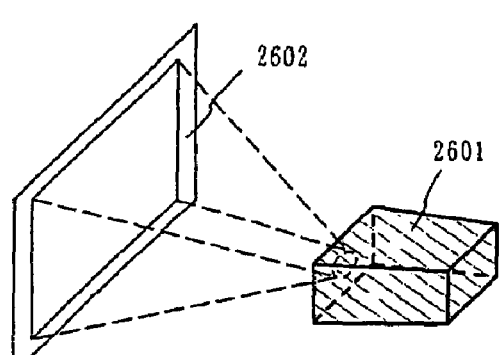
FIGS. 15A to 15D are diagrams showing examples of electronic equipment.

FIG. 15A is a front type projector which comprises: a projection system 2601; and a screen 2602. Embodiment 4 can be applied to the liquid crystal module 2808 which forms a part of the projection system 2601 to complete the whole system.

Figure 15B:
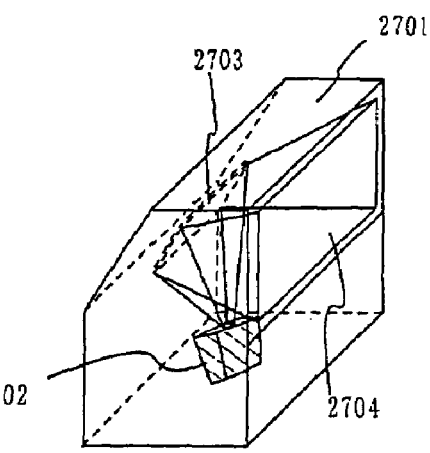

FIG. 15B is a rear type projector which comprises: a main body 2701; a projection system 2702; a mirror 2703; and a screen 2704. Embodiment 4 can be applied to the liquid crystal module 2808 which forms a part of the projection system 2702 to complete the whole system.

Figure 15C:
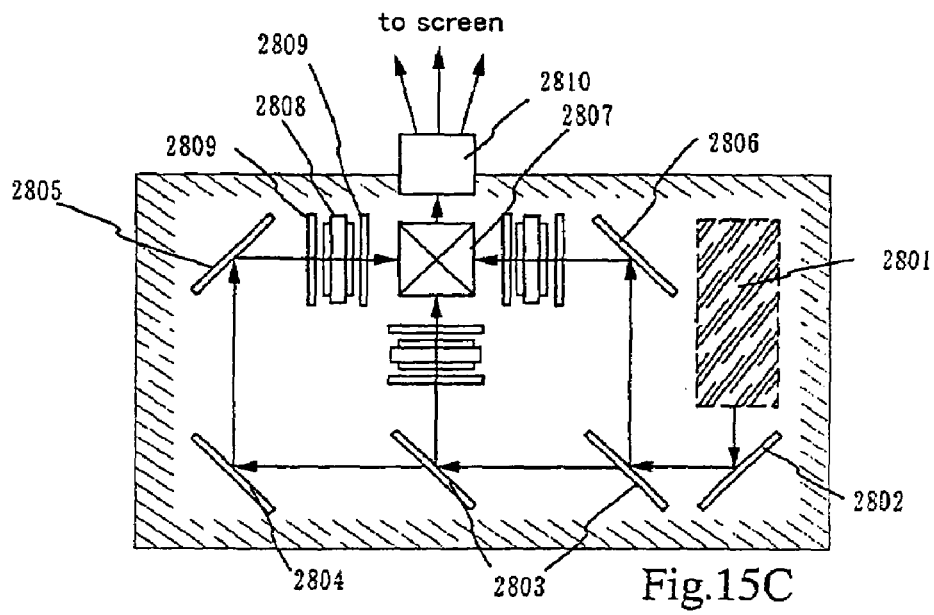

FIG. 15C is a diagram which shows an example of the structure of a projection system 2601 and 2702 in FIGS. 15A and 15B, respectively. Each of projection systems 2601 and 2702 comprises: an optical light source system 2801; mirrors 2802 and 2804 to 2806; a dichroic mirror 2803; a prism 2807; a liquid crystal module 2808; a phase differentiating plate 2809; and a projection optical system 2810. The projection optical system 2810 comprises an optical system having a projection lens. Though this embodiment shows an example of 3-plate type, this is not to limit to this embodiment and a single plate type may be used for instance. Further, an operator may appropriately dispose an optical lens, a film which has a function to polarize light, a film which adjusts a phase difference or an IR film, etc. in the optical path shown by an arrow in FIG. 15C.

Figure 15D:
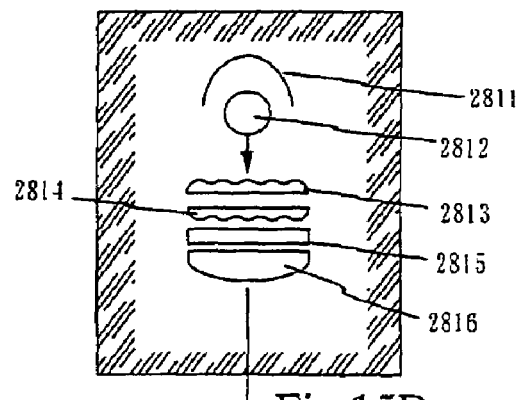

FIG. 15D is a diagram showing an example of a structure of an optical light source system 2801 in FIG. 15C. In this embodiment, the optical light source system 2801 comprises: a reflector 2811; a light source 2812; lens arrays 2813 and 2814; a polarizer conversion element 2815; and a collimator lens 2816. Note that the optical light source system shown in FIG. 15D is merely an example and the structure is not limited to this example. For instance, an operator may appropriately dispose an optical lens, a film which has a function to polarize light, a film which adjusts a phase difference or an IR film, etc.

Note that the projectors shown FIGS. 15A–15D are the cases of using a transmission type electro-optical device, and applicable examples of a reflection type electro-optical device and an EL module are not shown.

Figure 16A:
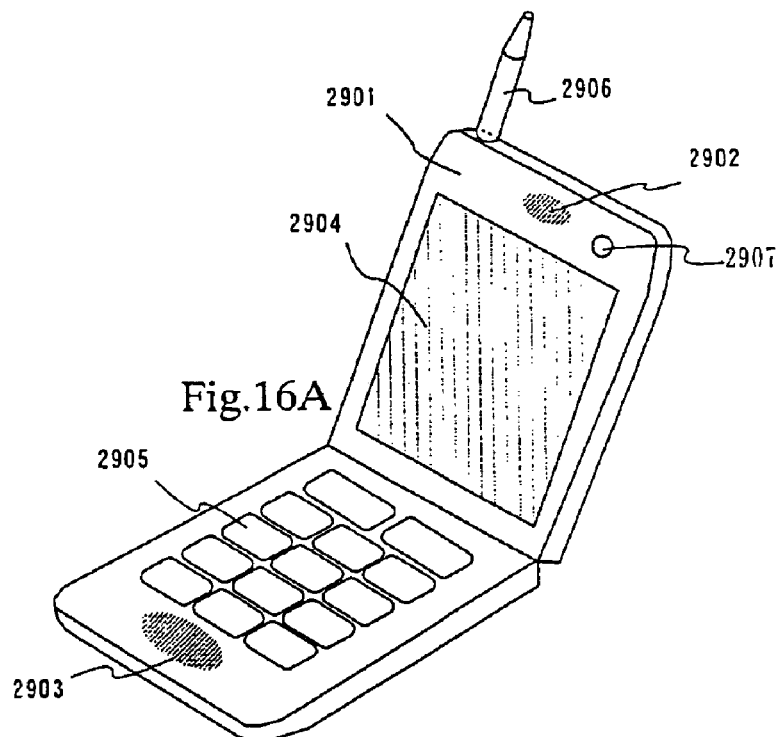
FIGS. 16A to 16C are diagrams showing examples of electronic equipment.

FIG. 16A is a mobile phone which comprises: a main body 2901; a voice output section 2902; a voice input section 2903; a display section 2904; operation switches 2905; an antenna 2906; and an image input section (CCD, image sensor, etc.) 2907 etc.

Figure 16B:
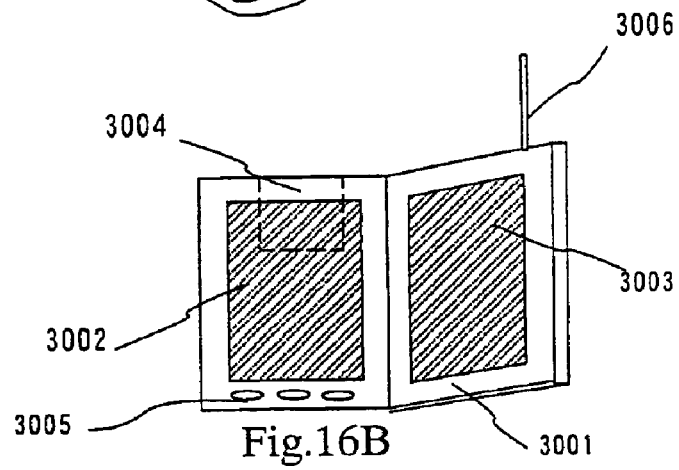

FIG. 16B is a portable book (electronic book) which comprises: a main body 3001; display sections 3002 and 3003; a recording medium 3004; operation switches 3005 and an antenna 3006 etc.

Figure 16C:
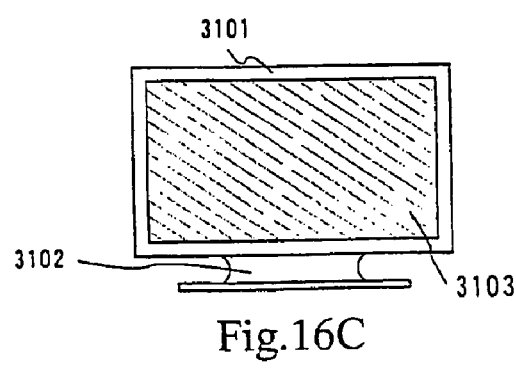

FIG. 16C is a display which comprises: a main body 3101; a supporting section 3102; and a display section 3103 etc.

In addition, the display shown in FIG. 16C is small and medium type or large type, for example, 5 to 20 inches screen display. Moreover, it is preferable to mass-produce by performing a multiple pattern using 1×1 m substrate to form such sized display section.

As described above, the applicable range of the present invention is very large, and the invention can be applied to electronic apparatuses of various areas. Note that the electronic devices of this embodiment can be achieved by utilizing any combination of constitutions in Embodiments 1 to 6.

Embodiment 8

Electrical characteristics of TFTs obtained by using the TFT manufacturing processes disclosed in Embodiment Mode 1 and in Embodiment Mode 2 are shown in FIGS. 17A to 19 in Embodiment 8.

Note that samples A1 to A3 shown in FIGS. 17A to 19 are TFTs manufactured by processes which are corresponding to Embodiment Mode 1 (n-channel TFTs, LUV=50/50), and that samples B1 to B3 are TFTs manufactured by processes which are corresponding to Embodiment Mode 2 (n-channel TFTs, L/W=50/50).

Processes for manufacturing the samples A1 to A3 are shown next. First, a base insulating film with a thickness of 150 nm (a 50 nm thick first silicon oxynitride film and a 100 nm thick second silicon oxynitride film) is formed on a glass substrate, and a 54 nm thick amorphous silicon film is formed on the base insulating film by plasma CVD. After forming an oxide film on the surface of the amorphous silicon film by using ozone water, a channel doping process of adding a p-type impurity element or an n-type impurity element with a low concentration is performed in order to control the threshold voltage of the TFT. Note that boron is added to the amorphous silicon film by using ion doping in which diborane ($B_2H_6$) is plasma-excited without mass separation, under doping conditions of an acceleration voltage of 15 kV, a flow rate of diborane gas of 30 sccm, and a dosage of $1\times10^{12}/cm^2$. A nickel acetate salt solution containing 10 ppm nickel by weight is then applied by using a spinner. Heat treatment is performed next to perform crystallization.

In the heat treatment, the sample A1 is crystallized by performing irradiation of strong light for 90 seconds at 700° C. with a multitask type lamp annealing apparatus with a total of 21 tungsten halogen lamps. Further, the samples A2 and A3 are crystallized by performing heat treatment using an oven (at 550° C. for 4 hours) after performing dehydrogenation for one hour at 500° C.

After the surfaces of the TFTs are then cleaned to remove natural oxide films and the like, laser light (first laser light: energy density 475 mJ/cm$^2$) is irradiated in the atmosphere or an oxygen atmosphere in order to increase crystallization rate (the proportion of crystalline components to the total volume of the film) and in order to repair defects remaining within crystal grains.

In irradiating the first laser light, the samples A1 and A3 are subjected to irradiation of an excimer laser under an oxygen and nitrogen atmosphere, while the sample A2 is subjected to irradiation in the atmosphere.

When laser light (first laser light) is irradiated, unevenness is formed in the surface together with a thin oxide film. In addition, an oxide film is formed by using an ozone containing solution (typically ozone water), to form a barrier layer of an oxide film with a total thickness of 1 to 10 nm. An amorphous silicon film containing argon element (which becomes gettering sites) is formed by sputtering to have a thickness of 150 nm on the barrier layer. Note that the oxide film formed in irradiating laser light can be considered as a portion of the barrier layer.

Next, irradiation of strong light is performed at 650° C. for 180 seconds using the lamp annealing apparatus, and gettering is performed to reduce the concentration of a metallic element (nickel) in, or remove the metallic element from, the first semiconductor film.

After the amorphous silicon film containing argon element is selectively etched next with the barrier layer as an etching stopper, the barrier layer of the oxide film is then removed.

Laser light (second laser light: energy density 535 mJ/cm$^2$) is then irradiated to the silicon film with the crystalline structure in a nitrogen atmosphere. Observation by optical microscope performed immediately after irradiating the second laser light confirmed the leveled surface of the silicon film, compared to the state immediately after irradiating the first laser light.

After a thin oxide film is then formed on the surface of the obtained silicon film comprising the crystalline structure (also referred to as a polysilicon film) by using ozone water, a mask of resist is formed. Etching into a predetermined shape is performed to separated semiconductor layers with island shape, and the resist mask is removed.

The oxide film is then removed by an etchant containing hydrofluoric acid, together with cleaning the surface of the silicon film at the same time. Next, an insulating film containing silicon as its main constituent, which becomes a gate insulating film, is formed by plasma CVD to silicon oxynitride film (composition: Si=32%, O=59%, N=7%, H=2%) with a thickness of 115 nm.

Subsequent processes are performed in accordance with Embodiment 1 from forming a gate electrode, and the TFTs of the samples A1 to A3 are manufactured.

A process for manufacturing the samples B1 to B3 is shown next. The samples A1 to A3 are TFTs irradiated by the second laser light after gettering while gettering is performed after irradiating the second laser light for the samples B1 to B3.

First, by using similar procedures to those for the samples A1 to A3, a base insulating film and an amorphous silicon film is formed on a substrate, a nickel acetate salt solution containing nickel is applied by using a spinner, and heat treatment is performed to perform crystallization and form a silicon film with crystalline structure.

The sample B1 is crystallized by performing irradiation of strong light at 700° C. for 90 seconds by using the lamp annealing apparatus in the heat treatment. Further, the samples B2 and B3 are crystallized by performing heat treatment using an oven (at 550° C. for 4 hours) after performing dehydrogenation for one hour at 500° C.

After the surfaces of the TFTs are then cleaned to remove natural oxide films and the like, laser light (first laser light: energy density 475 mJ/cm$^2$) is irradiated in the atmosphere or an oxygen atmosphere, in order to increase crystallization rate (the proportion of crystalline components to the total volume of the film) and in order to repair defects remaining within crystal grains.

The samples B1 and B3 are irradiated using excimer laser under an oxygen and nitrogen atmosphere when the first laser light is irradiated, while the sample B2 is irradiated using the excimer laser in the atmosphere.

Laser light (the second laser light: energy density 535 mJ/cm$^2$) is then irradiated to the silicon film with the crystalline structure under a nitrogen atmosphere after cleaning the surface to remove natural oxide films and the like. Observation by optical microscope immediately after irradiating the second laser light confirmed the leveled surface of the silicon film.

An oxide film is formed next by using an ozone containing solution (typically ozone water), to form a barrier layer of an oxide film with a thickness of 1 to 10 nm. An amorphous silicon film containing argon element (which becomes gettering sites) is formed by sputtering to have a thickness of 150 nm on the barrier layer.

Next, irradiation of strong light is performed at 650° C. for 180 seconds using the lamp annealing apparatus, and gettering is performed to reduce the concentration of a metallic element (nickel) in, or remove the metallic element from, the first semiconductor film.

The amorphous silicon film containing argon element is selectively etched next with the barrier layer as an etching stopper, and the barrier layer of the oxide film is then removed.

After a thin oxide film is then formed on the surface of the obtained silicon film with the crystalline structure (also referred to as a polysilicon film) by using ozone water, a mask of resist is formed. Etching into a predetermined shape is performed to form separated semiconductor layers with an island shape, and the resist mask is removed.

The oxide film is then removed by an etchant containing hydrofluoric acid, together with cleaning the surface of the silicon film at the same time. Next, an insulating film containing silicon as its main constituent, which becomes a gate insulating film, is formed by plasma CVD to silicon oxynitride film (composition: Si=32%, O=59%, N=7%, H=2%) with a thickness of 115 nm.

Subsequent processes are performed in accordance with Embodiment 1 from forming a gate electrode, similarly to the case of samples A1 to A3, and the TFTs of the samples B1 to B3 are manufactured.

Further, a comparative sample is also shown. The comparative sample is a TFT formed by performing irradiation of the first laser light under an oxygen and nitrogen atmosphere, without performing irradiation of the second laser light.

The electrical characteristics of the TFTs (samples A1 to A3, samples B1 to B3, and Comparative Sample) thus obtained in accordance with the above procedures were respectively measured.

Figure 17A:
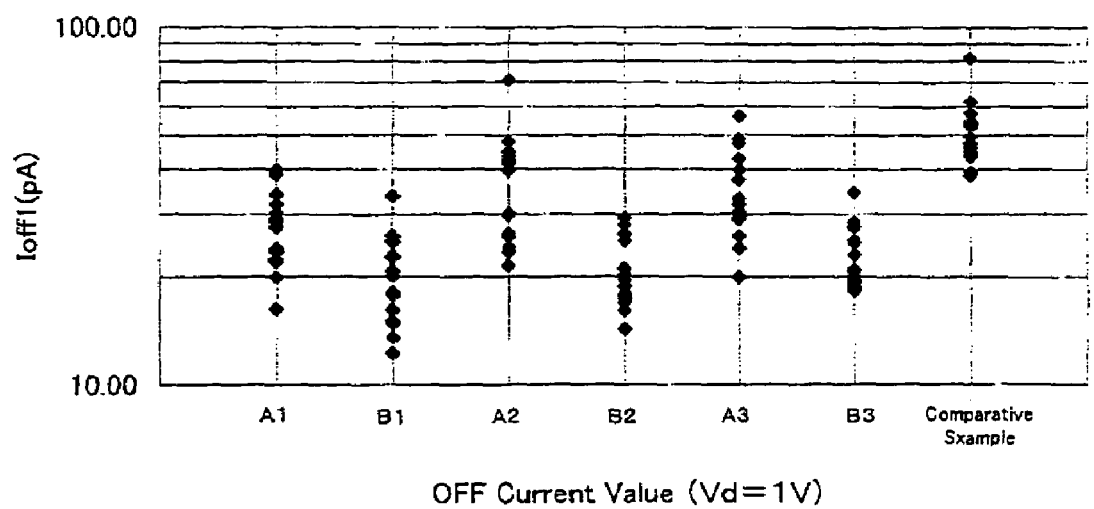
FIGS. 17A and 17B are graphs showing TFT characteristics (off current value)
Figure 17B:
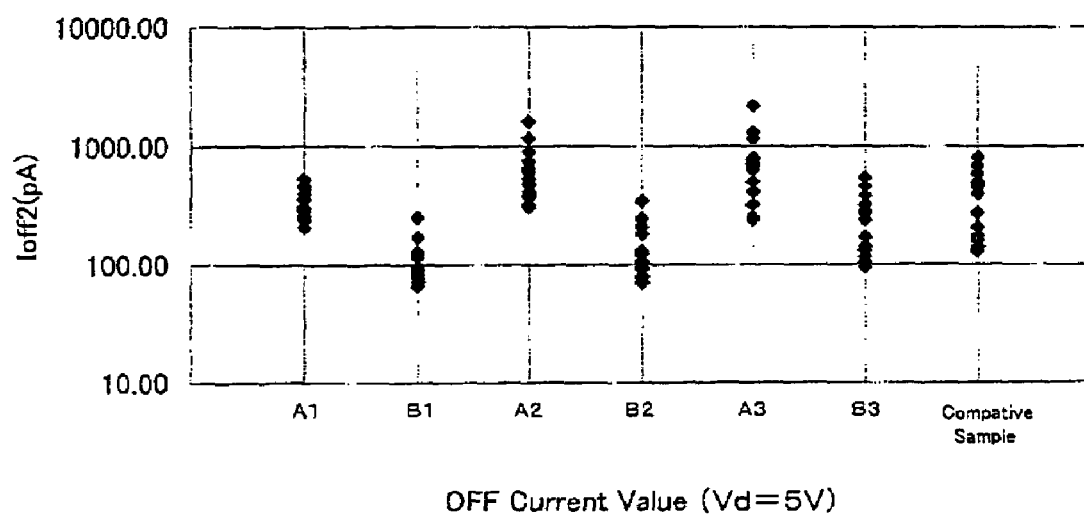

FIG. 17A shows the off current value at Vd=1 V (referred to as Ioff1), and FIG. 17B shows the off current value at Vd=5 V (referred to as Ioff2). It can be seen from FIGS. 17A and 17B that the off current values is lower for the samples A1 to A3 and for the samples B1 to B3, compared to the off current value of the comparative sample. Further, the off current values for the samples B1 to B3, which are subjected to the processes of Embodiment Mode 2, are lower than the off current values for the samples A1 to A3. It therefore can be said that Embodiment Mode 2, in which leveling by using the second laser light is performed before gettering, is preferable compared to Embodiment Mode 1, provided that importance is placed on the off current value.

Figure 18:
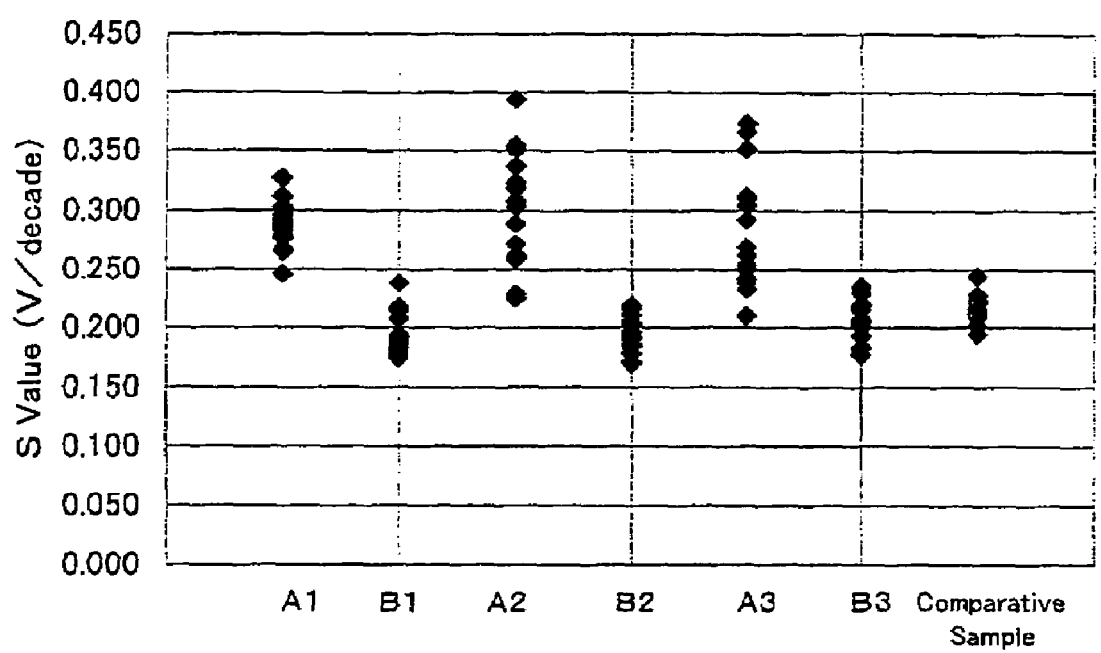
FIG. 18 is a graph showing TFT characteristics (S value)

Further, FIG. 18 shows the S value (subthreshold coefficient in the unit of V/decade). It can be seen that the S values of the samples B1 to B3 are lowest, and are good values. It can also be seen that the S values of the samples B1 to B3, which are subjected to the processes of Embodiment Mode 2, are lower than those of the samples A1 to A3.

Figure 19:
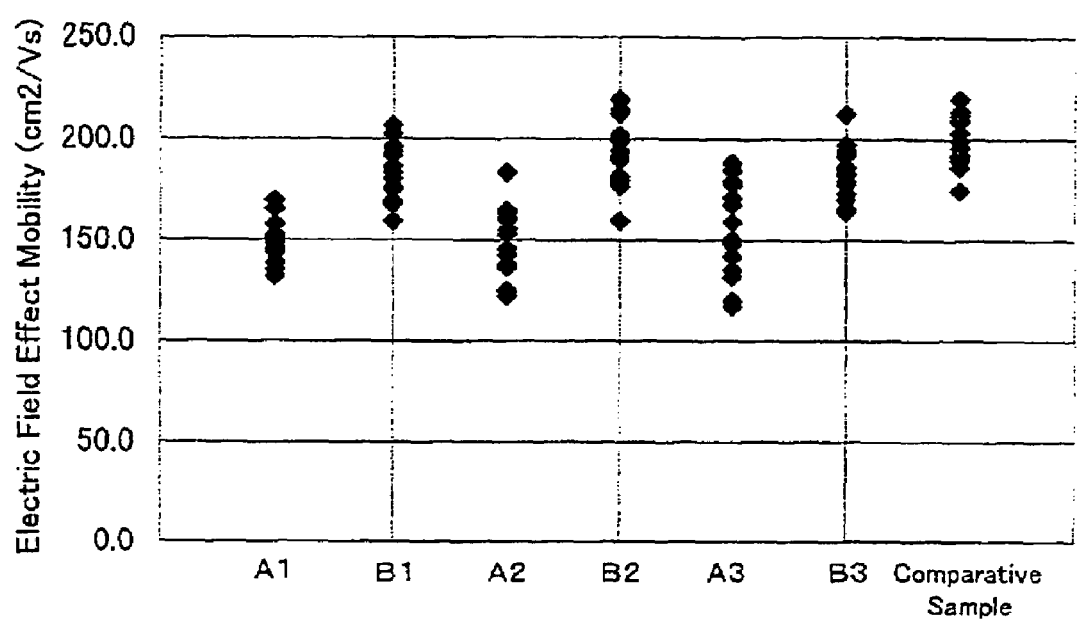
FIG. 19 is a graph showing TFT characteristics (electric field effect mobility)
Figure 20:
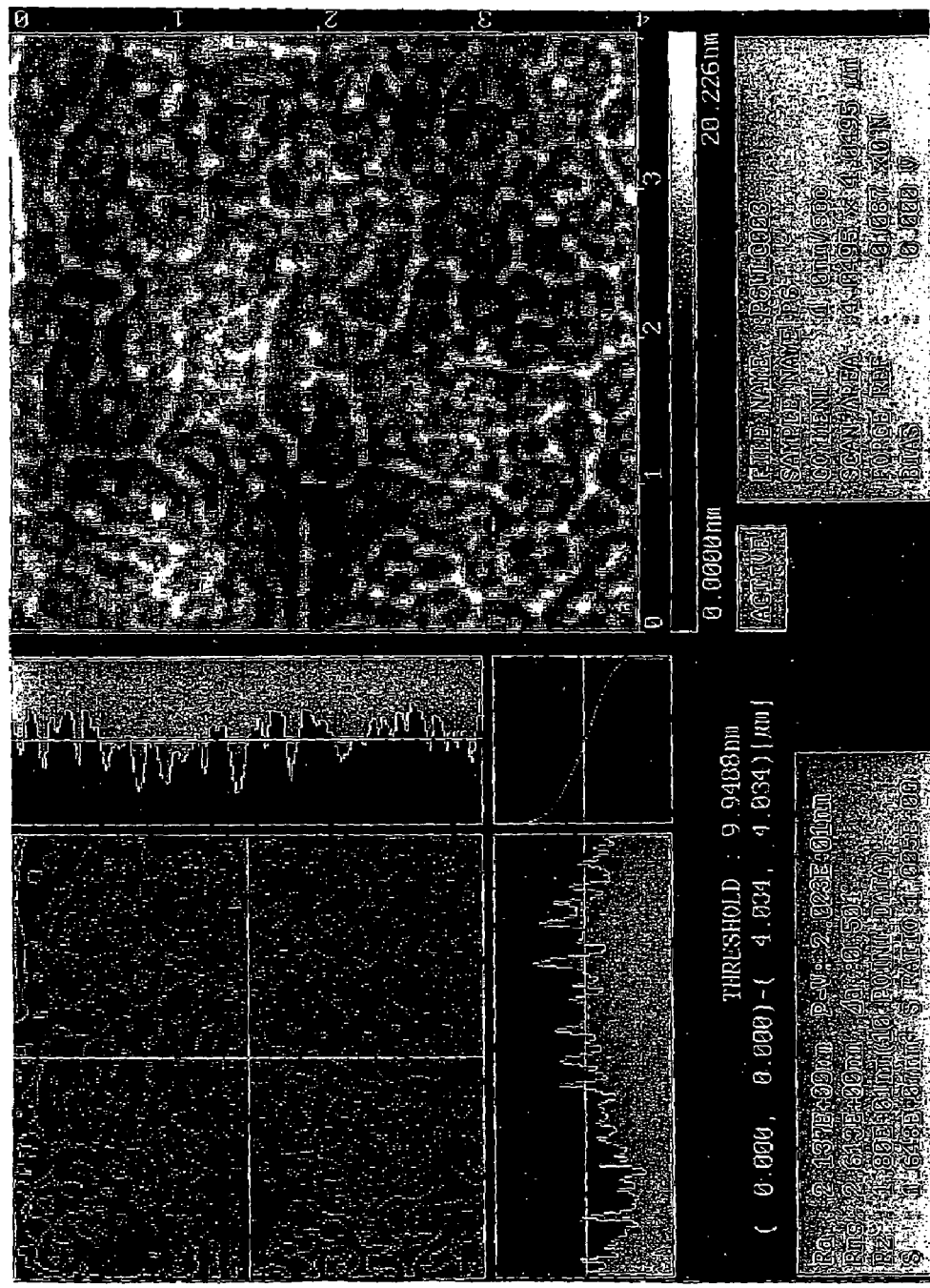
FIG. 20 shows the results of AFM observation of a semiconductor film surface (4 μm×4 μm)
Figure 21:
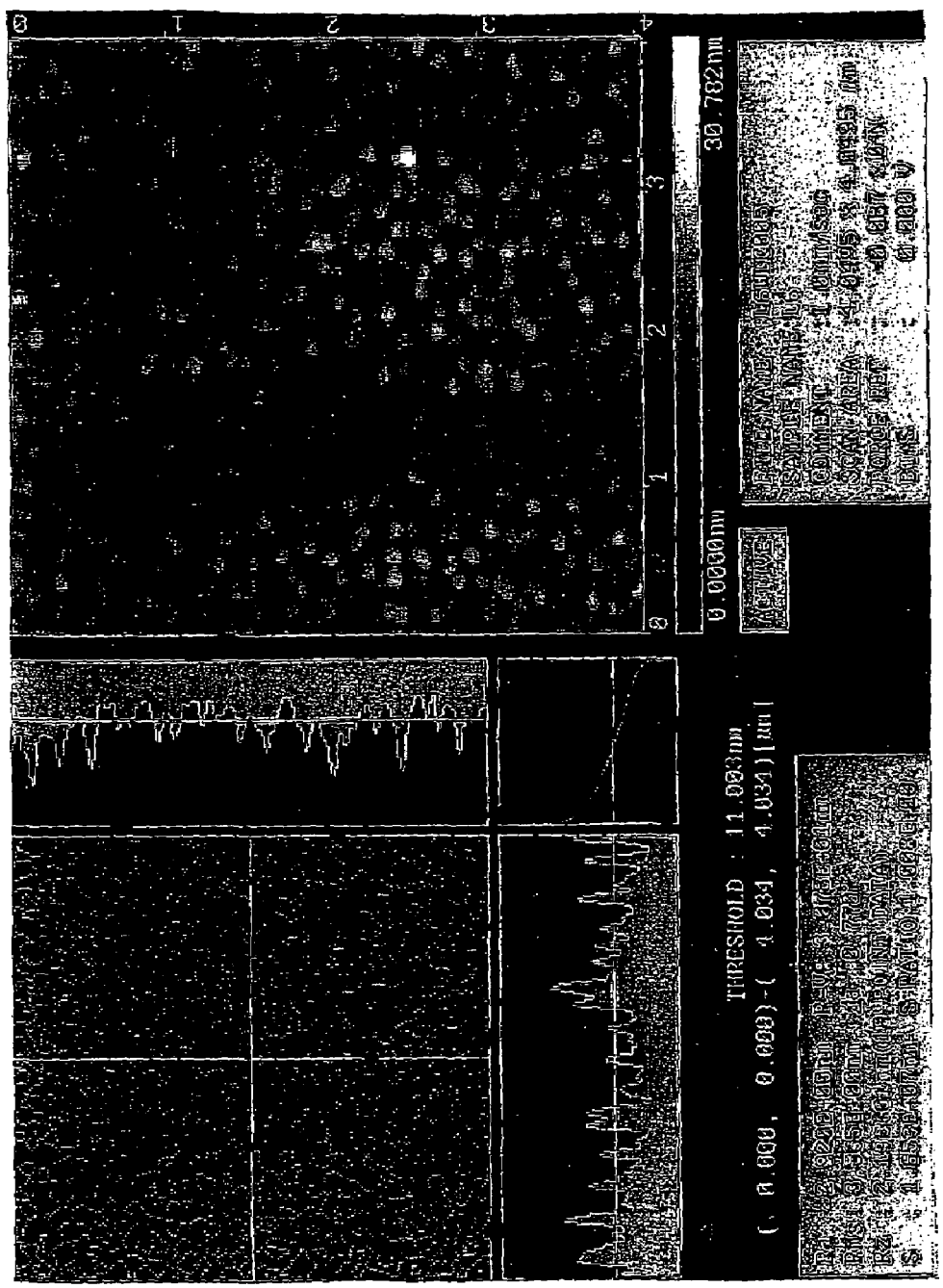
FIG. 21 shows the results of AFM observation of a comparative sample of a semiconductor film surface (4 μm×4 μm)

FIG. 19 shows the electric field effect mobility ($\mu$FE, also referred to as mobility, in the unit of cm$^2$/Vs). It can be seen that the values of the electric field effect mobility of the samples B1 to B3 are high, and good values. Furthermore, it can be seen that the electric field effect mobility values of the samples B1 to B3, which are subjected to the processes of Embodiment Mode 2, are higher than those of the samples A1 to A3.

The effects of Embodiment Mode 1 and Embodiment Mode 2 can be confirmed by the experimental results of FIGS. 17A to 19.

According to the present invention, the levelness of semiconductor films can be greatly increased, metallic elements added for promoting crystallization can be removed efficiently, the electrical characteristics of TFTs using the semiconductor films as active layers can be increased, and dispersion in individual elements can be reduced. In particular, display irregularities in liquid crystal display devices due to dispersion in TFT characteristics can be reduced.

In addition, according to the present invention, the levelness of semiconductor films can be greatly increased, and dispersion in respective TFTs can be reduced. In particular, the TFT off current value can be reduced, and dispersion in the off current value can be suppressed at the same time. Accordingly, the operational characteristics of semiconductor devices using such TFTs can be improved, and a lowering of the amount of electric power consumption can be achieved. In semiconductor devices which have OLEDs, dispersion of the on current (Ion) of TFTs arranged in order that a fixed electric current flows to pixel electrodes (TFTs for supplying electric current to OLEDs disposed in driver circuits or pixels) can be lowered, and therefore dispersion in brightness can also be reduced.

What is claimed is:

1. A method of manufacturing a semiconductor device comprising:
    a first step of forming a first semiconductor film comprising an amorphous structure on an insulating surface;
    a second step of adding a metallic element to the first semiconductor film;
    a third step of irradiating first laser light to the first semiconductor film after performing heat treatment to form a second semiconductor film comprising a crystalline structure and an oxide film on the second semiconductor film;
    a fourth step of performing oxidation of a surface of the second semiconductor film by using a solution comprising ozone;
    a fifth step of forming a third semiconductor film comprising an inert gas element over the oxide film;
    a sixth step of gettering the metallic element into the third semiconductor film to reduce the concentration of the metallic element in the second semiconductor film;

a seventh step of removing the third semiconductor film;
an eighth step of removing the oxide film; and
a ninth step of irradiating second laser light in an inert gas atmosphere or in a vacuum to level a surface of the second semiconductor film.

2. A method of manufacturing a semiconductor device according to claim 1, wherein the sixth step is performed with thermal treatment.

3. A method of manufacturing a semiconductor device according to claim 1, wherein the sixth step is performed by irradiating strong light to the second semiconductor film.

4. A method of manufacturing a semiconductor device according to claim 1, wherein thermal treatment is performed and irradiation of strong light to the second semiconductor film is performed in the sixth step.

5. A method of manufacturing a semiconductor device according to claim 3, wherein the strong light is light emitted from a halogen lamp, a metal halide lamp, a xenon arc lamp, a carbon arc lamp, a high pressure sodium lamp, or a high pressure mercury lamp.

6. A method of manufacturing a semiconductor device according to claim 4, wherein the strong light is light emitted from a halogen lamp, a metal halide lamp, a xenon arc lamp, a carbon arc lamp, a high pressure sodium lamp, or a high pressure mercury lamp.

7. A method of manufacturing a semiconductor device according to claim 1, wherein the energy density of the first laser light is higher than the energy density of the second laser light.

8. A method of manufacturing a semiconductor device according to claim 1, wherein the inert gas atmosphere is a nitrogen atmosphere.

9. A method of manufacturing a semiconductor device according to claim 1, wherein the heat treatment in the third step is thermal treatment or irradiation of strong light.

10. A method of manufacturing a semiconductor device according to claim 1, wherein the third semiconductor film is formed by sputtering with semiconductor as a target in an atmosphere containing an inert gas element.

11. A method of manufacturing a semiconductor device according to claim 1, wherein the third semiconductor film is formed by sputtering with semiconductor containing phosphorous or boron as a target in an atmosphere containing an inert gas.

12. A method of manufacturing a semiconductor device according to claim 1, wherein the metallic element is an element, or a plurality of elements, selected from the group consisting of Fe, Ni, Co, Ru, Rh, Pd, Os, Ir, Pt, Cu and Au.

13. A method of manufacturing a semiconductor device according to claim 1, wherein the inert gas element is an element, or a plurality of elements, selected from the group consisting of He, Ne, Ar, Kr, and Xe.

* * * * *